US008717793B2

(12) United States Patent
Maurya et al.

(10) Patent No.: US 8,717,793 B2
(45) Date of Patent: May 6, 2014

(54) LONGEST PREFIX MATCH INTERNET PROTOCOL CONTENT ADDRESSABLE MEMORIES AND RELATED METHODS

(75) Inventors: Satendra Kumar Maurya, Tempe, AZ (US); Lawrence T. Clark, Phoenix, AZ (US)

(73) Assignee: Arizona Board of Regents, for and on Behalf of Arizona State University, Scottsdale, AZ (US)

( * ) Notice: Subject to any disclaimer, the term of this patent is extended or adjusted under 35 U.S.C. 154(b) by 228 days.

(21) Appl. No.: 13/321,309

(22) PCT Filed: May 26, 2010

(86) PCT No.: PCT/US2010/036264
§ 371 (c)(1),
(2), (4) Date: Nov. 18, 2011

(87) PCT Pub. No.: WO2010/138639
PCT Pub. Date: Dec. 2, 2010

(65) Prior Publication Data
US 2012/0063189 A1 Mar. 15, 2012

Related U.S. Application Data

(60) Provisional application No. 61/181,187, filed on May 26, 2009, provisional application No. 61/345,016, filed on May 14, 2010, provisional application No. 61/347,778, filed on May 24, 2010.

(51) Int. Cl.
*G11C 15/00* (2006.01)

(52) U.S. Cl.
USPC .................................... 365/49.17; 365/49.18

(58) Field of Classification Search
USPC .................................. 365/49.17, 49.18, 49.1
See application file for complete search history.

(56) References Cited

U.S. PATENT DOCUMENTS

| 6,058,403 | A | * | 5/2000 | Vijayrao et al. ............... 708/211 |
| 6,499,081 | B1 | | 12/2002 | Nataraj et al. |
| 6,588,006 | B1 | * | 7/2003 | Watkins ........................ 716/103 |
| 6,665,297 | B1 | | 12/2003 | Hariguchi et al. |
| 7,027,445 | B1 | | 4/2006 | Sunada et al. |
| 7,596,010 | B2 | * | 9/2009 | Nishiyama et al. ........ 365/49.17 |
| 2004/0024757 | A1 | | 2/2004 | Park et al. |

OTHER PUBLICATIONS

International Search Report for PCT/US2010/036264 mailed Dec. 28, 2010.

* cited by examiner

*Primary Examiner* — Vu Le
(74) *Attorney, Agent, or Firm* — Withrow & Terranova, P.L.L.C.

(57) ABSTRACT

Embodiments of content addressable memories for internet protocol devices and operations are described herein. Other examples and related methods are also disclosed herein.

27 Claims, 17 Drawing Sheets (a) Logical View          (b) Floorplan

LONGEST PREFIX MATCH INTERNET PROTOCOL CONTENT ADDRESSABLE MEMORIES AND RELATED METHODS

CROSS REFERENCE TO RELATED APPLICATIONS

This application is a 35 U.S.C. 371 national phase filing of PCT/US2010/036264 filed May 26, 2010, which claims priority to:

U.S. Provisional Patent Application 61/181,187, filed on May 26, 2009;
U.S. Provisional Patent Application 61/345,016, filed on May 14, 2010; and
U.S. Provisional Patent Application 61/347,778, filed on May 24, 2010.

The contents of the applications listed above are incorporated herein by reference.

TECHNICAL FIELD

The present invention relates generally to memory circuits. More particularly the present invention relates to longest prefix match internet protocol content addressable memories and related methods.

BACKGROUND

The internet is a mesh of interconnected routers. The internet protocol (IP) part of the TCP/IP protocol stack is used for communicating data between the routers. The large and constantly increasing internet traffic volume depends on continuously increasing router efficacy.

A routers function is to forward incoming packets towards their final destination, which they reach in multiple hops. To forward packets toward their final destination the router has to perform address lookup, buffering, scheduling, and finally, send the packet to the next hop address through the appropriate router port. The address lookup, being associative, is a key processing bottleneck requiring the matching of a destination IP address encoded in the incoming packet against a table stored in the router. Packets are routed on a next-hop basis, i.e., the router sends an incoming packet to the next hop only—the packet reaches its final destination in multiple hops. Each router has a database, in the form of a routing table containing prefixes of varying length and for each, their corresponding next hop port (NHP).

Classless Inter Domain Routing

The internet protocol (IP) has the task of delivering distinguished protocol datagrams (packets) from the source host to the destination host, based solely on their destination addresses. The IP has worked extremely well, allowing exponential growth of the internet. Initially, IP addresses were divided into the five categories, known as classes. To expand the usable IP address space, classless inter-domain routing (CIDR) was implemented. CIDR allocates IP addresses in variable-sized blocks without regard to the previously used classes. CIDR was initially implemented for IPv4 where the address length is 32-bits. With continued internet growth, this address range is being exhausted. Consequently, IPv6 with 128-bit addressing is being introduced.

Classless inter-domain routing (CIDR) was implemented in 1993 to cope with the increasing demand by allocating addresses in variable-sized blocks without regard to the previously used five classes. Using CIDR, a routing table entry is identified by a route prefix, a prefix length (in the form of mask bits) and an associated output port identifier. The CIDR address lookup mechanism is based on longest prefix matching, using two steps: First the routing database (table) is searched to obtain the longest matching prefix from the many that may match the packets' destination IP address. Secondly, the next hop port associated with this longest matched prefix is determined and the packet is forwarded to the appropriate destination/port. If none of the prefixes sufficiently match the destination IP address, the packet is sent to a default port. The initial CIDR implementation (IPv4) uses a 32-bit address length. The dramatic growth of the internet is rapidly exhausting this address range, so IPv6, with 128-bits addresses is being introduced.

Longest Prefix Matching

Routing based on longest prefix matching essentially routes the packet to a location as close as possible to the destination. The destination address of an incoming packet is compared with all of the current prefixes in the routing table to determine the next hop associated with the longest matching prefix. If no prefixes match the destination IP address, the packet is sent to a default port. The length of the valid part of addresses can vary up to 32 bits in IPv4, and up to 128 bits in IPv6. Mask bits determine the valid lengths of the address, i.e., address bits for which mask bits are '1' are valid and the rest of the address is ignored (see FIG. 1) working from MSB (most significant bit) towards LSB (least significant bit).

FIG. 1 shows a conventional routing table implementation. It consists of match block and priority encoder block. Address bits for which mask bits are '1' are valid and the rest of the address is ignored (see FIG. 1). Hence mask bits are set to '1' in at least part of the MSB and to '0' for the unused IP address LSB bits. The addresses are grouped together and strictly ordered by mask size. The mask associated with each address is also shown. For instance, when a destination IP address of 192.160.0.128 is compared with the prefixes in the table, it matches with the address stored at locations 2, 1003 and 1005 but the priority encoder (PE) selects the location 2 as it has the longest prefix match. This pointer is used to read the NHP information stored in SRAM or DRAM.

Another example of an IPv4 prefix table is shown in Table 1. When a destination IP address 128.45.67.12 is compared with the prefixes, it matches entries 1, 4 and 5. The packet forwards to the destination specified in next hop port 12 since it is the longest prefix match.

TABLE 1

IPv4 routing table example

| Prefix | Mask | Next Hop Port |
| --- | --- | --- |
| 128.45.67.12 | 255.255.255.128 | 4 |
| 192.125.167.129 | 255.0.0.0 | 6 |
| 192.45.121.112 | 255.255.0.0 | 2 |
| 128.45.67.35 | 255.255.255.0 | 9 |
| 128.45.67.12 | 255.255.255.255 | 12 |

Ordering the entries makes selecting the longest prefix match straightforward—these operations resemble leading zeros detection, since the bottommost match (logic 1) in the table is selected. However, the strict ordering requires that the routing table be taken off-line when new entries are added, since insertions may require substantial shifts in the data locations.

Software IP Lookup

Software approaches have the advantage of programmability, but the associative lookup requires multiple clock cycles. A tree based data structure can be used for IP address storage and lookup. For IPv4, the longest prefix length may be 32 bits so an IP lookup requires up to 32 memory accesses. To decrease the memory accesses required, a complete binary tree expansion has been proposed but this requires an array with $2^{32}$ entries. A forwarding table scheme reduces the memory storage size and accesses, but is also large. In general, any software approach on standard microprocessors must comprehend issues such as the impact of cache misses, the number and latency of memory accesses, and multiple processor dock cycles for search execution.

Hardware IP Lookup

IP routing hardware mostly concentrates on matching the destination address with the addresses in the routing table, which while only part of the IP lookup problem, is, as mentioned, the bottleneck. Wade et al. proposed an addressable search engine using a TCAM structure for a database accelerator chip and a modified ripple chain priority encoder. Chuang et al. also proposed using CAM structures. Pei et al. implemented a high radix tree in silicon for exact matching, using a CAM-based forwarding table. Degermark et al. used SRAM and improved the performance by converting the forwarding table radix tree to a complete tree by filling the empty branches, requiring at most four memory accesses. Gupta et al. proposed a two memory access, two-level indirect lookup scheme. Adding a length field to the first (segment) table that maintains the length of the second (offset) table allows a variable offset and thus more efficient memory utilization.

TCAM Based IP Lookup

FIG. 1 is the top level architectural view of a TCAM based router. All valid combinations of w-bit IP prefixes may require as many as $2^{w+1}-1$ entries, i.e., one for the null prefix, covering all entries, plus as many 1 through up to 32-bit prefixes as needed. CAMs provide a single clock latency matching solution. Ternary content addressable memory (TCAM) allows longest prefix match (IP lookup) operation by using the stored "don't-care" state to mask matches, with multiple entries to allow multiple mask lengths to be considered. Each TCAM cell has two stored bits—one for the address and one for the mask. Akhbarizadeh, et al., encoded the mask bit in the address for each 8-bit block using only nine SRAM cells but with a more complicated match line structure. As in the TCAMs, each entry can only compare one prefix length. Thus, entries are required for each possible matching prefix length, i.e., from N to M, where N is the default (no match) address length, and M is the mask length. Obviously, up to M-N entries may match a given address for a single entry, with many other matches obtained from others.

Dynamic NOR match lines discharge on a mismatch, resulting in high match line activity factor, as most entries don't match, which leads to high power dissipation. Series transistor connected (NAND) match lines can reduce power, but these large stacks invite charge sharing issues. These can in turn, be addressed by using a hierarchy of short stacks or pre-charging the intermediate nodes. Multiple TCAM chips, dissipating up to 15 W each, are required in a high end router.

The conventional TCAM requires finding the longest match by finding the match closest to the bottom of the lookup table, and this is similar to leading zeros detection (it searches for the bottommost logic 1). One such approach is a multi-level look-ahead design using domino logic. These designs are complicated in that the signals cascading from one stage to the next must be domino compatible (monotonic) and impose large clock loading.

Reference TCAM

To provide meaningful power, density and speed comparisons, a reference TCAM array implemented in the same bulk CMOS 65 nm process technology is used in this work. The cell design is shown in FIG. 2(a). Although other cell designs are denser (see FIG. 2(b)), the design in FIG. 2(a) has the least match line capacitance and thereby, lower search power dissipation. It consists of two SRAM cells storing the address and mask bits, respectively. 32 cells, combined with a pre-charge, keeper and latch block comprise one row in an array for address comparison. The basic TCAM block has up to 31 entries for a 32-bit IPv4 address.

BRIEF DESCRIPTION OF THE DRAWINGS

To facilitate further description of the embodiments, the following drawings are provided in which.

Figure 1:
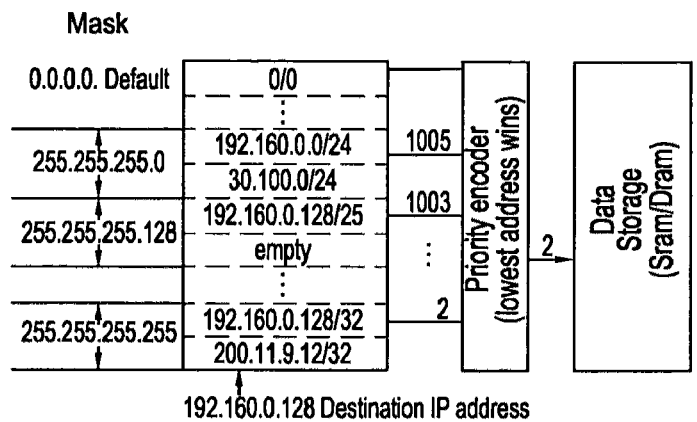
FIG. 1 is shows a high-level schematic of an implementation of a routing table comprising a match block and a priority encoder block.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled together but not be mechanically or otherwise coupled together, two or more mechanical elements may be mechanically coupled together, but not be electrically or otherwise coupled together; two or more electrical elements may be mechanically coupled together, but not be electrically or otherwise coupled together. Coupling may be for any length of time, e.g., permanent or semi-permanent or only for an instant.

An electrical "coupling" and the like should be broadly understood and include coupling involving any electrical signal, whether a power signal, a data signal, and/or other types or combinations of electrical signals. A mechanical "coupling" and the like should be broadly understood and include mechanical coupling of all types. The absence of the word "removably," "removable," and the like near the word "coupled," and the like does not mean that the coupling, etc. in question is or is not removable.

DESCRIPTION

In a first embodiment, an integrated circuit comprises a first match block of one or more match blocks. The first match block comprises a first IPCAM head module and a first match circuit. The first IPCAM module comprises a first forwarding address memory to store a first forwarding address entry of one or more forwarding address entries, and an input to receive a destination address. The first match circuit configured to determine a longest matching prefix between the first forwarding address entry and the destination address and to encode a first encoded match length of the longest matching prefix. There can be examples similar or related to the first embodiment described above, such as the following ones:

In one example, the first forwarding address memory comprises a first address memory to store a first forwarding address of the first, forwarding address entry, and a first mask memory to store a first mask of the first forwarding address entry. In the same or other example, the first encoded match length comprises a thermometer code. The first match block may requires a single entry of the first forwarding address to determine the longest matching prefix between the first forwarding address entry and the destination address in the same or other examples.

In one example, an architecture of the first match block is expandable to support at least one of an IPv4 addressing scheme of 32 bits per address, or an IPv6 addressing scheme of 128 bits per address.

In one example, each of the one or more match blocks is configured to store one forwarding address entry of the one or more forwarding address entries, and the one or more forwarding address entries are stored in the one or more match blocks regardless of match length order.

In one example, the first match block comprises a dynamic IPCAM array. The first IPCAM head module comprises a first group of IPCAM heads configured for a bitwise comparison between a first group of bits of the first forwarding address entry and a first group of bits of the destination address. The first match circuit comprises a first group of switches coupled to and controllable by the first group of IPCAM heads, and a first group of match lines coupled to and controllable by the first group of switches. The first group of switches is configured to control the first group of match lines so that a quantity of contiguous MSB matches from the bitwise comparison correlates with a quantity of enabled match lines of the first group of match lines.

In one example, the first group of match lines comprises a first match line, the first group of switches comprises a first switch configured to control the first match line, the first group of IPCAM heads comprises a first IPCAM head, the first IPCAM head comprises a first search line configured to carry a first bit of the destination address, a first forwarding address bitcell of the first forwarding address memory, an XOR gate comprising XOR inputs coupled to the first forwarding address bitcell and to the first search line, and an XOR output coupled to the first switch, a first charge circuit coupled to the first match line, and a first mask bitcell for the first forwarding address bitcell, the first mask bitcell coupled to the first charge circuit of the first match line.

In one example, the first forwarding address bitcell is configured to store a first forwarding address bit, the first mask bitcell is configured to store a first mask bit, the first charge circuit is configured to precharge the first match line when the first mask bit is enabled, and to discharge the first match line when the first mask bit is disabled, and the XOR gate is configured to discharge the first match line, via the first switch, when the first bit of the destination address and the first forwarding address bit mismatch.

In one example, the first group of IPCAM heads comprises a first IPCAM head and a second IPCAM head, the first group of switches comprises a first switch set coupled to and controlled by the first IPCAM head, and a second switch set coupled to and controlled by the second IPCAM head. The first switch set comprises a first switch of the first switch set. The second switch set comprises a first switch of the second switch set, and a second switch of the second switch set. The first group of match lines comprises a first match line coupled to and controlled by the second switch of the second switch set, and a second match line coupled to and controlled by the first switch of the first switch set and by the second switch of the second switch set.

In one example, the first IPCAM head is configured to detect a first mismatch between: a first bit of the first forwarding address entry, and a first bit of the first destination address. The second IPCAM head is configured to detect a second mismatch between a second bit of the first forwarding address entry, and a second bit of the first destination address. When the first IPCAM head detects the first mismatch the second switch of the second switch set is actuated to discharge the second match line, and when the second IPCAM head detects the second mismatch, the first switch of the first switch set is actuated to discharge the first match line and the first switch of the second switch set is actuated to discharge the second match line.

In one example, the first match block further comprises a second IPCAM head module. The second IPCAM head module comprises a second group of IPCAM heads configured for a bitwise comparison between a second group of bits of the first forwarding address entry, and a second group of bits of the destination address. The first match block further comprises a second match circuit comprising a second group of switches coupled to and controllable by the second group of IPCAM heads and a second group of match lines coupled to and controllable by the second group of switches. The first match block further comprises a first transmission module coupled between the first and second match circuits. When the first group of bits of the destination address matches the first group of bits of the first forwarding address entry at the first group of IPCAM heads, the first transmission module is enabled to couple the first and second groups of match lines together, and the second group of match lines are output from the first match block via the first group of match lines.

In one example, when the first group of bits of the destination address mismatches the first group of bits of the first forwarding address entry at the first group of IPCAM heads, the first transmission module is disabled to decouple the first and second groups of match lines together from each other, and the first group of match lines are output from the first match block.

In one example, the first match block further comprises a first group-output match line of one or more group-output match lines, and a first group-match line comprising one match line of the first group of match lines. The first group-match line is controllable by each IPCAM head of the first group of IPCAM heads via the first group of switches. When the first group of bits of the destination address matches the first group of bits of the first forwarding address entry at the first group of IPCAM heads, the first group-output match line is enabled by the first group-match line to signal the match between the first group of bits of the destination address and the first group of bits of the first forwarding address entry.

In one example, the first match block further comprises a third IPCAM head module comprising a third group of IPCAM heads configured for a bitwise comparison between a third group of bits of the first forwarding address entry and a third group of bits of the destination address. The first match block further comprises a third match circuit comprising a third group of switches coupled to and controllable by the third group of IPCAM heads, and a third group of match lines coupled to and controllable by the third group of switches. The first match block further comprises a second transmission module coupled between the second and third match circuits and configured to couple the third group of match lines to the second group of match lines when the second group of bits of the first forwarding address entry matches the second group of bits of the destination address. The first match block further comprises a fourth IPCAM head module comprising a fourth group of IPCAM heads configured for a bitwise comparison between a fourth group of bits of the first forwarding address entry, and a fourth group of bits of the destination address. The first match block further comprises a fourth match circuit comprising a fourth group of switches coupled to and controllable by the fourth group of IPCAM heads, and a fourth group of match lines coupled to and controllable by the fourth group of switches. The first match block further comprises a third transmission module coupled between the third and fourth match circuits and configured to couple the fourth group of match lines to the third group of match lines when the third group of bits of the first forwarding address entry matches the third group of bits of the destination address, a second group-match line comprising one match line of the second group of match lines, a third group-match line comprising one match line of the third group of match lines, and a fourth group-match line comprising one match line of the fourth group of match lines. The second group-match line is controllable by each IPCAM head of the second group of IPCAM heads via the second group of switches, the third group-match line is controllable by each IPCAM head of the third group of IPCAM heads via the third group of switches, and the fourth group-match line is controllable by each IPCAM head of the fourth group of IPCAM heads via the fourth group of switches.

In one example, the first match block comprises a static IPCAM array. The first IPCAM head module comprises a first group of IPCAM heads configured for a bitwise comparison between a first group of bits of the first forwarding address entry, and a first group of bits of the destination address. The first match circuit comprises a first group of encoding gates coupled to the first group of IPCAM heads to encode the bitwise comparison, and a first group of match lines configured to couple to the first group of encoding gates. The first group of encoding gates is configured to control the first group of match lines so that a quantity of enabled match lines of the first group of match lines indicates a quantity of contiguous MSB matches from the bitwise comparison.

In one example, the first group of IPCAM heads comprises a first IPCAM head. The first IPCAM head comprises a first search line configured to carry a first bit of the destination address, a first forwarding address bitcell to store a first bit of the first forwarding address entry, a first mask bitcell configured to store a first mask bit, an XOR gate comprising XOR inputs coupled to the first forwarding address bitcell and to the first search line, and an XOR output, and a match gate comprising a first input coupled to the XOR output, a second input coupled to the first mask bitcell, and a first match output. When the first mask bit is asserted, the match gate is configured to de-assert the first match output. When the first mask bit is de-asserted, the match gate is configured to assert the first match output when the XOR output indicates a match between the first bit of the destination address and the first bit of the first forwarding address entry, and de-assert the first match output when the XOR output indicates a mismatch between the first bit of the destination address and the first bit of the first forwarding address entry.

In one example, the first group of IPCAM heads comprises the first IPCAM head comprising a first match output, and a second IPCAM head comprising a second match output. The first group of match lines comprises a first match line, and a second match line. The first group of encoding gates comprises a first gate comprising a first gate input coupled to the first match output, and a first gate output to control the first match line. The first group of encoding gates comprises a second gate comprising a second gate input coupled to the first match output, a second gate input coupled to the second match output, and a second gate output to control the second match line. The first match output of the first IPCAM head is asserted when a first forwarding address bit of the first group of bits of the first forwarding address entry matches a first destination address bit of the first group of bits of the destination address. The second match output of the second IPCAM head is asserted when a second forwarding address bit of the first group of bits of the first forwarding address entry matches a second destination address bit of the first group of bits of the destination address. The second gate is configured to assert the second match line only when both the first and second match outputs are asserted.

In one example, The first group of IPCAM heads further comprises a third IPCAM head comprising a third match output, and a fourth IPCAM head comprising a fourth match output. The first group of match lines comprises a third match line, and a fourth match line. The first group of encoding gates comprises a third gate and a fourth gate. The third gate comprises a third gate input coupled to the first match output a third gate input coupled to the second match output a third gate input coupled to the third match output, and a third gate output to control the third match line. The fourth gate comprises a fourth gate input coupled to the first match output, a fourth gate input coupled to the second match output, a fourth gate input coupled to the third match output, a fourth gate input coupled to the fourth match output, and a fourth gate output to control the fourth match line. The third match output of the third IPCAM head is asserted when a third forwarding address bit of the first group of bits of the first forwarding address entry matches a third destination address bit of the first group of bits of the destination address. The fourth match output of the fourth IPCAM head is asserted when a fourth forwarding address bit of the first group of bits of the first forwarding address entry matches a fourth destination address bit of the first group of bits of the destination address. The third gate is configured to assert the third match line only when all of the first, second, and third match outputs are asserted. The fourth gate is configured to assert the fourth match line only when all of the first, second, third, and fourth match outputs are asserted.

In one example, the first group of IPCAM heads further comprises a fifth IPCAM head comprising a fifth match output, a sixth IPCAM head comprising a sixth match output, a seventh IPCAM head comprising a seventh match output, and an eighth IPCAM head comprising an eighth match output. The first group of match lines comprises fifth, sixth, seventh, and eighth match lines. The first group of encoding gates comprises a fifth gate configured to assert the fifth match line only when all of the first, second, third, fourth, and fifth match outputs are asserted, a sixth gate configured to assert the sixth match line only when all of the first, second, third, fourth, fifth, and sixth match outputs are asserted, a seventh gate configured to assert the seventh match line only when all of the first, second, third, fourth, fifth, sixth, and seventh match outputs are asserted, and an eighth gate configured to assert the eighth match line only when all of the first, second, third, fourth, fifth, sixth, seventh, and eight match outputs are asserted.

In one example, the first match block further comprises a group of bitmatch output lines, and a first transmission module coupled between the group of bitmatch output lines and the first group of match lines. The first forwarding address entry comprises forwarding address greater significant bits, and forwarding address lesser significant bits. The destination address comprises destination address greater significant bits. When the first group of bits of the first forwarding address entry comprises the forwarding address greater significant bits, the first transmission module is configured to couple the first group of match lines to the group of bitmatch output lines when the first group of bits of the first forwarding address entry mismatches the first group of bits of the destination address. When the first group of bits of the first forwarding address entry comprises the forwarding address lesser significant bits, the first transmission module is configured to couple the first group of match lines to the group of bitmatch output lines when both the first group of bits of the first forwarding address entry mismatches the first group of bits of the destination address and the destination address greater significant bits match the forwarding address greater significant bits.

In one example, the first match block further comprises a first group-output match line of one or more group-output match lines. When the first group of bits of the first forwarding address entry comprises the forwarding address greater significant bits the first group-output match line is asserted when the first group of bits of the first forwarding address entry matches the first group of bits of the destination address. When the first group of bits of the first forwarding address entry comprises the forwarding address lesser significant bits, the first group-output match line is asserted when both the first group of bits of the first forwarding address entry matches the first group of bits of the destination address, and the destination address greater significant bits match the forwarding address greater significant bits.

In one example, the first match block further comprises a second IPCAM head module for bitwise comparison between a second group of bits of the first forwarding address entry, and a second group of bits of the destination address. The first match block further comprises a second match circuit coupled to the second IPCAM head module and comprising a second group of match lines. The first match block further comprises a third IPCAM head module for bitwise comparison between a third group of bits of the first forwarding address entry, and a third group of bits of the destination address. The first match block further comprises a third match circuit coupled to the third IPCAM head module and comprising a third group of match lines. The first match block further comprises a fourth IPCAM head module for bitwise comparison between a fourth group of bits of the first forwarding address entry, and a fourth group of bits of the destination address. The first match block further comprises a fourth match circuit coupled to the fourth IPCAM head module and comprising a fourth group of match lines. The first match block further comprises a second transmission module coupled between the group of bitmatch output lines and the second group of match lines. The first match block further comprises a third transmission module coupled between the group of bitmatch output lines and the third group of match lines. The first match block further comprises a fourth transmission module coupled between the group of bitmatch output lines and the fourth group of match lines. The one or more group-output match lines further comprise first, second, third, and fourth group-output match lines. The first group-output match line is asserted when the first group of bits of the first forwarding address entry matches the first group of bits of the destination address. The second group-output match line is asserted when the first group of bits of the first forwarding address entry matches the first group of bits of the destination address, and the second group of bits of the first forwarding address entry matches the first group of bits of the destination address. The third group-output match line is asserted when the first group of bits of the first forwarding address entry matches the first group of bits of the destination address, the second group of bits of the first forwarding address entry matches the first group of bits of the destination address, and the third group of bits of the first forwarding address entry matches the third group of bits of the destination address. The fourth group-output match line is asserted when the first group of bits of the first forwarding address entry matches the first group of bits of the destination address, the second group of bits of the first forwarding address entry matches the first group of bits of the destination address, the third group of bits of the first forwarding address entry matches the third group of bits of the destination address, and the fourth group of bits of the first forwarding address entry matches the fourth group of bits of the destination address.

In one example, a priority encoder can be coupled to the one or more match blocks. The one or more match blocks are configured to forward a plurality of encoded match lengths comprising an encoded match length from each of the one or more match blocks, including the first encoded match length, and forward a plurality of forwarding addresses comprising a forwarding address from each of the one or more match blocks, including the first forwarding address entry. The priority encoder is configured to receive the plurality of encoded match lengths, determine a longest encoded match length of the plurality of encoded match lengths, and forward a next hop address associated with the longest encoded match length, the next hop address comprising a longest matching prefix forwarding address entry of the one or more forwarding address entries.

In one example, the priority encoder comprises at least one of a dynamic priority encoder, a static binary tree priority encoder, or a static two-stage priority encoder.

There can be examples where one or more of the examples described above for the first embodiment can be inter-related or depend from each other.

In a second embodiment, an integrated circuit comprises a priority encoder configured to determine a longest encoded match length from a plurality of encoded match lengths associated with a plurality of forwarding addresses, and to forward a next hop address associated with the longest encoded match length, the next hop address comprising a longest matching prefix forwarding address of the plurality of forwarding addresses. There can be examples where the first and second embodiments are related to each other. There can also be examples similar or related to the second embodiment described above, such as the following ones:

In one example, the priority encoder comprises a first comparison circuit comprising a first input to receive a first encoded match length of the plurality of encoded match lengths, the first encoded match length comprising a first group-match bit set, and a first bit-match bit set. The first encoded match length is derived from a bitwise comparison between a first forwarding address of the plurality of forwarding addresses comprises, and a destination address. The first forwarding address comprises a greater significant group of forwarding address bits, and a lesser significant group of forwarding address bits. The destination address comprises a greater significant group of destination address bits, and a lesser significant group of destination address bits. The first group-match bit set comprises a group-match bit indicative of a group match between the greater significant group of forwarding address bits, and the greater significant group of destination address bits. The first bit-match bit set comprises first and second bit-match bits. The first bit-match bit indicative of a bit match between a first bit of the lesser significant group of forwarding address bits, and a first bit of the lesser significant group of destination address bits. The second bit-match bit is indicative of a bit match between a second bit of the lesser significant group of forwarding address bits and a second bit of the lesser significant group of destination address bits.

In one example, one or more match blocks can be coupled to the priority encoder and configured to determine a longest matching prefix between a destination address and each of the plurality of forwarding addresses, and encode the plurality of encoded match lengths for each of the plurality of forwarding addresses based on each of the longest matching prefixes.

In one example, the priority encoder comprises a dynamic-NOR priority encoder.

In one example, the priority encoder comprises a static binary tree priority encoder comprising a plurality of comparison circuits coupled together in a binary tree arrangement. a first comparison circuit of the plurality of comparison circuits comprises first and second inputs, and first, second, and third comparison modules. The first input is configured to receive a first encoded match length of the plurality of encoded match lengths, the first encoded match length comprising a first group-match bit set, and a first bit-match bit set. The second input is configured to receive a second encoded match length of the plurality of encoded match lengths, the second encoded match length comprising a second group-match bit set, and a second bit-match bit set. The first comparison module comprises first inverter module and a first NAND module. The first inverter module comprises an input to receive the second group-match bit set, and an output to forward an inverted second group-match bit set of the second group-match bit set. The first NAND module comprises an input coupled to the output of the first inverter module to receive the inverted second group-match bit set, an input to receive the first group-match bit set, and a first output to forward a first signal indicative of whether the first group-match bit set is greater than the second group-match bit set. The second comparison module comprises second inverter module and a second NAND module. The inverter module comprises an input to receive the first group-match bit set, and an output to forward an inverted first group-match bit set generated from the first group-match bit set. The second NAND module comprises an input coupled to the output of the second inverter module to receive the inverted first group-match bit set, an input to receive the second group-match bit set, and a second output to forward a second signal indicative of whether the first group-match bit set is lesser than the second group-match bit set. The third comparison module comprises third inverter module and a third NAND module. The third inverter module comprises an input to receive the first bit-match bit set, and an output to forward an inverted first bit-match bit set generated from the first bit-match bit set. The third NAND module comprises an input coupled to the output of the third inverter module to receive the inverted first bit-match bit set, an input to receive the second bit-match bit set, and a third output to forward a third signal indicative of whether the first bit-match bit set is lesser than the second bit-match bit set.

In one example, the first comparison circuit further comprises a selection module comprising an inverter, an OR circuit, and a NAND circuit. The inverter comprises an input coupled to the first output of the first comparison module to receive the first signal, and an output to forward an inverted first signal of the first signal. The OR circuit comprises an input coupled to the second output of the second comparison module to receive the second signal, an input coupled to the third output of the third comparison module to receive the third signal, and an output to forward a fourth signal indicative of whether the first group-match bit set is lesser than the second group-match bit set or the first bit-match bit set is lesser than the second bit-match bit set. The NAND circuit comprises an input coupled to the output of the inverter to receive the inverted first signal, an input coupled to the output of the OR circuit to receive the fourth signal, and a select output to forward a select signal indicative of whether the first encoded match length is longer than the second encoded match length.

In one example, the first comparison circuit further comprises at least one of a match length multiplexor or a forwarding address multiplexor. The match length multiplexor comprises an input coupled to receive the first encoded match length, an input coupled to receive the second encoded match length, a control terminal coupled to the select output to receive the select signal, and an output configured to forward the first encoded match length when the select signal is asserted, and to forward the second encoded match length when the select signal is de-asserted. The forwarding address multiplexor comprises an input coupled to receive, out of the plurality of forwarding addresses, a first forwarding address associated with the first encoded match length, an input coupled to receive, out of the plurality of forwarding addresses, a second forwarding address associated with the second encoded match length, a control terminal coupled to the select output to receive the select signal, and an output configured to forward the first forwarding address when the select signal is asserted, and to forward the second forwarding address when the select signal is de-asserted.

In one example, the first NAND module comprises first, second, and third NAND gates. The first NAND gate comprises an input coupled to the output of the first inverter module to receive a most significant bit of the inverted second group-match bit set, an input to receive a most significant bit of the first group-match bit set, and a first NAND gate output. The second NAND gate comprises an input coupled to the output of the first inverter module to receive a least significant bit of the inverted second group-match bit set, an input to receive a least significant bit of the first group-match bit set, and a second NAND gate output. The third NAND gate comprises an input coupled to the first NAND gate output, an input coupled to the second NAND gate output, and a third NAND gate output coupled to the first output of the first NAND module.

In one example, each of the plurality of encoded match lengths comprises a group-match bit set and a bit-match bit set. The priority encoder comprises a static columnwise-OR priority encoder, comprising an input to receive the plurality of encoded match lengths, a first stage OR-module, and a first stage comparator module. The first stage OR-module comprises inputs to receive the group-match bit sets of the plurality of encoded match lengths, circuitry to bitwise-OR the group-match bit sets with each other and into a group-match OR-result bit set, and an output to forward the group-match OR-result bit set. The first stage comparator module comprises an input coupled to the output of the first stage OR-module to receive the group-match OR-result bit set; circuitry to bitwise compare the group-match OR-result bit set against each of the group-match bit sets, and an output to forward a group-match comparator result for each of the group-match bit sets.

In one embodiment, a first one of the group-match comparator results is indicative of whether a first one of the group-match bit sets matches the group-match OR-result bit set, and a second one of the group-match comparator results is indicative of whether a second one of the group-match bit sets matches the group-match OR-result bit set.

In one embodiment, a subset of the bit-match bit sets comprises one or more of the bit-match bit sets having a corresponding group-match bit set that matches the group-match OR-result bit set at the first stage comparator module. The static-OR priority encoder further comprises a second stage OR-module and a second stage comparator module. The second stage OR-module comprises inputs to receive the bit-match bit sets of the plurality of encoded match lengths, circuitry to bitwise-OR the subset of the bit-match bit sets with each other and into, a bit-match OR-result bit set, and an output to forward the bit-match OR-result bit set. The second stage comparator module comprises an input coupled to the output of the second stage OR-module to receive the bit-match OR-result bit set, circuitry to bitwise compare the bit-match OR-result bit set against each of the bit-match bit sets, and an output to forward a bit-match comparator result for each of the bit-match bit sets.

In one embodiment, a first one of the group-match comparator results is indicative of whether a first one of the group-match bit sets matches the group-match OR-result bit set, a second one of the group-match comparator results is indicative of whether a second one of the group-match bit sets matches the group-match OR-result bit set; a first one of the bit-match comparator results is indicative of whether a first one of the bit-match bit sets matches the bit-match OR-result bit set, a second one of the bit-match comparator results is indicative of whether a second one of the bit-match bit sets matches the bit-match OR-result bit set, the first one of the group-match bit sets and the first one of the bit-match bit sets correspond to associated with a first one of the plurality of encoded match lengths, and the second one of the group-match bit sets and the second one of the bit-match bit sets correspond to a second one of the plurality of encoded match lengths.

In one embodiment, the static columnwise-OR priority encoder further comprises a next hop port multiplexer comprising an input for each of the plurality of forwarding addresses, control lines driven by each of the bit-match comparator results from the second stage comparator module, and an output to forward a next hop port address of the plurality of forwarding addresses. The next hop port address comprises a next hop encoded match length of the plurality of encoded match lengths. The next hop encoded match length comprises a next hop group-match bit set that matches the group-match OR-result bit set from the first stage OR-module, and a next hop bit-match bit set that matches the bit-match OR-result bit set from the second stage OR-module.

There can be examples where one or more of the examples described above for the second embodiment can be interrelated or depend from each other.

In a third embodiment, a method comprises providing a first match block of one or more match blocks of a content addressable memory integrated circuit. Providing the first match block can comprise providing a first IPCAM head module, and providing a first match circuit. Providing the first IPCAM head module can comprise providing a first forwarding address memory to store a first forwarding address entry of one or more forwarding address entries, and providing an input to receive a destination address. Providing the first match circuit can comprise configuring the first match circuit to determine a longest matching prefix between the first forwarding address entry and the destination address, and to encode a first encoded match length of the longest matching prefix.

There can be examples where the first, second, and/or embodiments can be related to each other. There can also be examples similar or related to the third embodiment described above, such as the following ones:

In one embodiment, a priority encoder can be provided coupled to the one or more match blocks, wherein the one or more match block are configured to forward a plurality of encoded match lengths comprising an encoded match length from each of the one or more match blocks, including the first encoded match length, and to forward a plurality of forwarding addresses comprising a forwarding address from each of the one or more match blocks, including the first forwarding address entry, and wherein the priority encoder is configured to receive the plurality of encoded match lengths, determine a longest encoded match length of the plurality of encoded match lengths, and to forward a next hop address associated with the longest encoded match length, the next hop address comprising a longest matching prefix forwarding address entry of the one or more forwarding address entries.

In one embodiment, providing the first match block comprises providing the first match block to comprise only static circuitry.

There can be examples where one or more of the examples described above for the third embodiment can be inter-related or depend from each other. Other embodiments of the invention, and related examples and methods, are discussed herein.

IPCAM Next Hop Table

Figure 3:
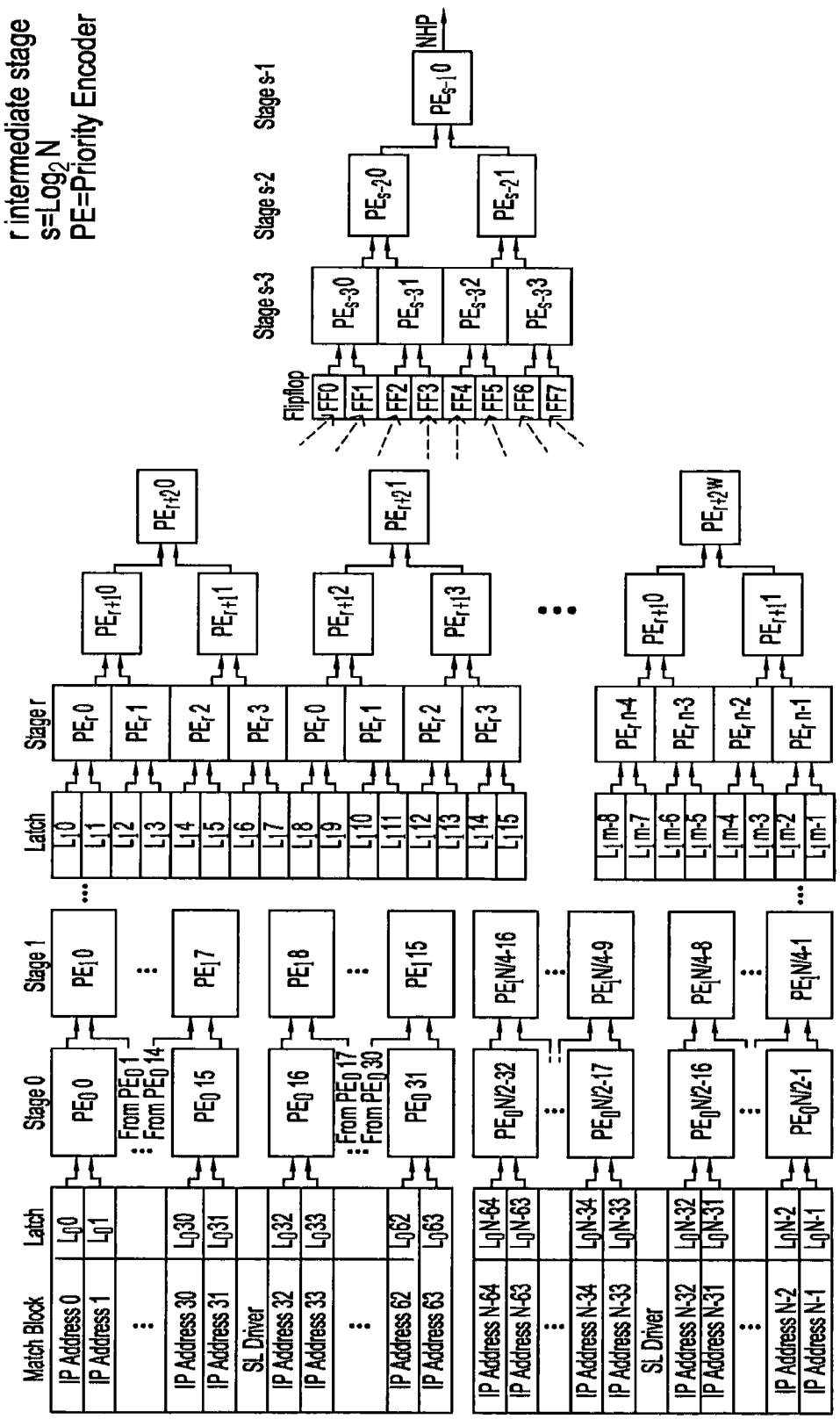
FIG. 3 shows a diagram of a next hop table architecture comprising match blocks and priority encoders.

A proposed next hop table architecture is shown in FIG. 3. The forwarding table consists of N address entries, stored in the IPCAM. Using the input address, each entry in the proposed IPCAM match block directly computes the longest matching contiguous bits from a single stored address and mask word. Consequently, the number of table entries is reduced by up to 31 times over the TCAM approach. The match block operates on all the N entries in parallel. Each entry determines the number of MSB bits of the stored address that match the input destination address. The result is passed to the PE.

The IPCAM entries need not be sorted in match length order, since any entry can match from zero up to its mask length bits. Consequently, conventional priority encoders may not be used. The PE proposed here essentially sorts the match lengths output by the IPCAM circuit, forwarding the best value at each stage. Each PE sorting circuit operates on two sets of inputs at a time and generates as its output the best match count and the associated best matching address. Thus, a binary tree of 2:1 priority encoder sorting circuits is used to compute the overall longest prefix match as shown in FIG. 3. At the end, the address of the best match (the NHP) is output to determine the address of the corresponding next hop address.

The number of PE sorting stages required for N addresses is Log, N. The total number of PE sorting circuits required is N−1. Since the PE operation takes much longer than the IPCAM lookup, the priority encoder can be pipelined. The clock period depends on the IPCAM match block delay ($D_m$). Thus, the priority encoder path uses 2 $D_m/D_p$ sorting circuit pipeline stages, delivering one match length and address per clock cycle, where $D_p$ is the delay of each 2:1 PE sorting circuit. The latch after the match block allows time borrowing, i.e., the PE operation can begin in the first clock phase.

IPCAM Match Block Circuit—Dynamic Implementation

Figure 4A:
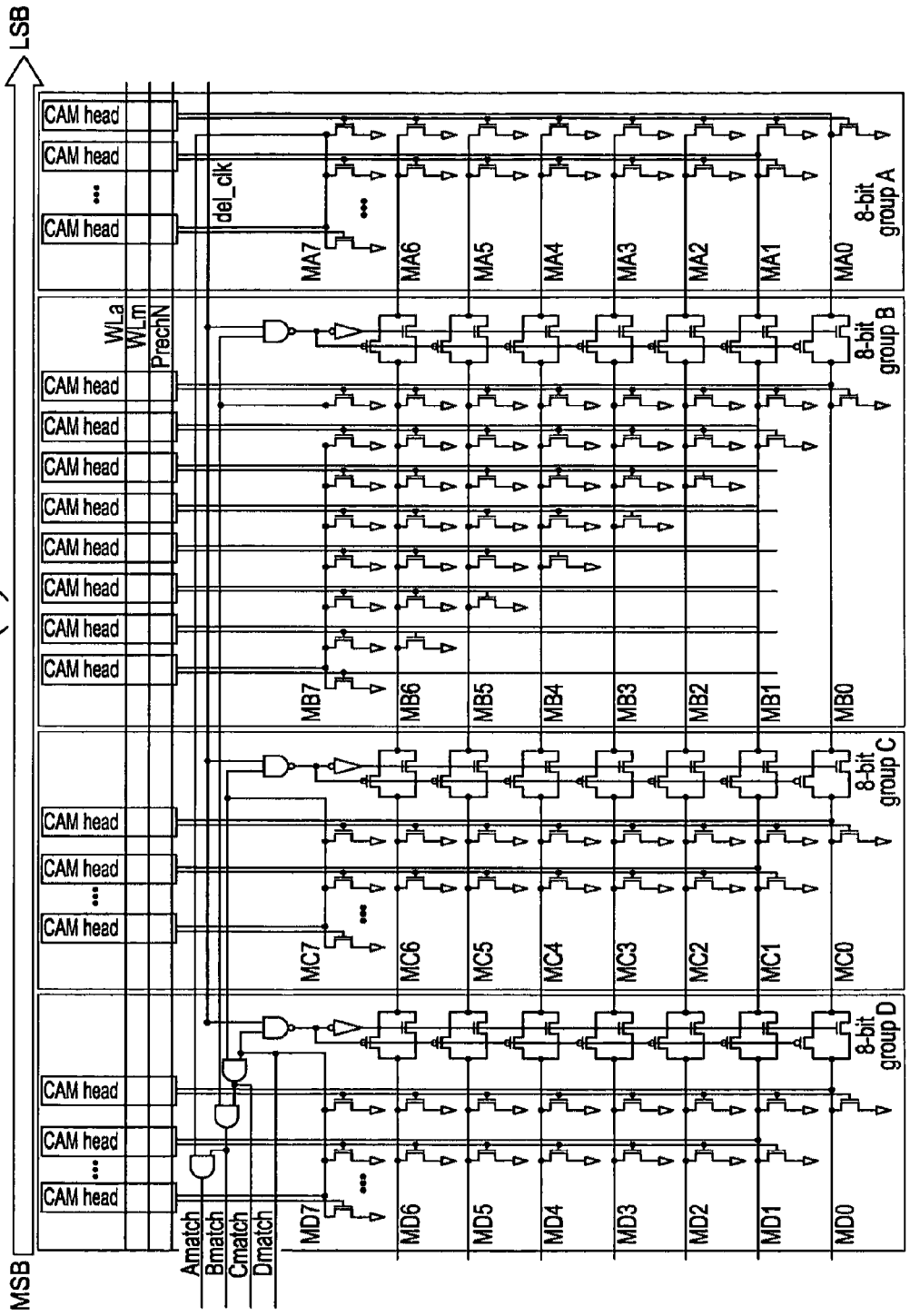
FIG. 4A shows a schematic of a dynamic internet protocol content addressable memory (IPCAM) array match block with dynamic circuitry.

FIG. 4A illustrates a schematic of a proposed IPCAM array with dynamic circuitry. In some examples, the IPCAM array of FIG. 4A, and/or other dynamic IPCAMs, may be referred to as a D-IPCAM. The IPCAM array directly computes the longest matching contiguous bits from a single stored address and mask word. Consequently, the storage requirements are reduced by up to 32 times compared to the TCAM approach.

Figure 4B:
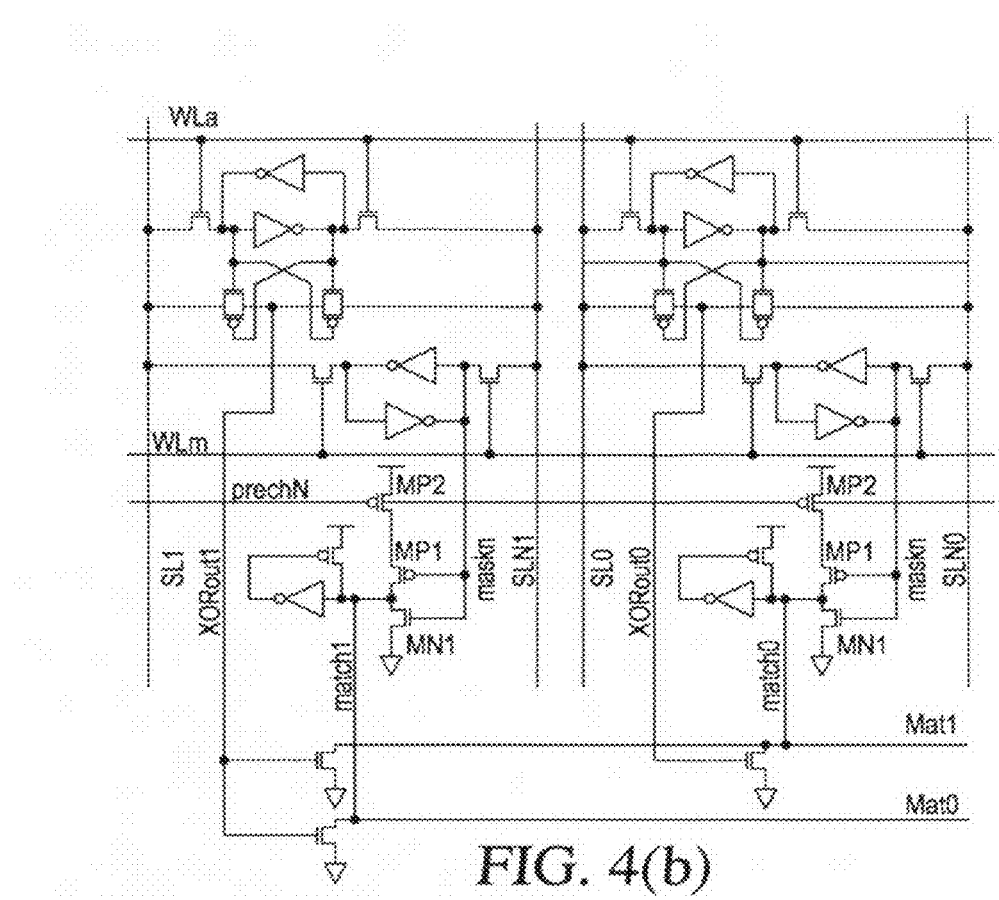
FIG. 4B shows a schematic of a CAM head circuit for two sequential CAM heads of the dynamic IPCAM array of FIG. 4A.

Each IPCAM block contains a single address, but controls seven match lines labeled M(A-D)0-6 and four group match lines labeled (A-D)match. The circuit is divided into groups of eight bits (labeled group A-D) to limit the capacitive loading (fan-out) of each circuit and to allow a shorter match length encoding. FIG. 4B illustrates a schematic of a CAM head circuit for two sequential CAM heads of the IPCAM array of FIG. 4A. Each CAM head circuit drives from 1 to 8 match line pull down transistors.

In operation, one of the clock ANDed differential search lines for each of the 32 columns is asserted high in the first clock phase, starting a match operation. The column-wise XOR network in each CAM head cell of each column determines if the stored address matches the incoming address bit for that column. If not, the signal XORout (see FIG. 4) which drives the match line pull down transistors for that column, is asserted high. Each match line connected to that CAM head cell is then discharged. The groups of eight columns thus have a triangular configuration, i.e., the leftmost column can discharge any of the eight match lines, but the rightmost only the topmost match line, e.g., MD7. The critical path delay is thus through the group A column driving eight pull down transistors, the match line with eight pull down transistors (e.g., MD7), the NAND gate, inverter and finally, the propagation delay of the MA0-6 values through the B through D 8-bit group match lines. The signal del_clk must arrive after the 8-bit groups have evaluated, to open the pass gates.

When an entire group matches, i.e., all 8 bits in the group match the incoming address, that group signals out on one of the signals (A-D)match that this has occurred by asserting (A-D)match. For instance, if the 8 MSB's match, node MD7 stays high, it directly asserts node Dmatch (node MD7's alias). If the next 8-bit group matches, then Cmatch is asserted to indicate a 16-bit match. The AND gates ensure that proper codes are output. The match lines are reused so allow transfer of the subsequent (the group to the left) 8 bit group's match information through the same match lines. This limits the metal usage as the cell block is metal limited. If 8-bit groups C and D fully match, but there is a mismatch at the 5th bit in group B, then the CMOS pass gates for groups C and D are opened. The output signals MD0-6 indicate the state of the group B match lines MB0-6. Assuming 4 bits match in group B, the outputs are Amatch=Bmatch=0, Cmatch=Dmatch=1, MD0-3=1, and MD4-6=0. The (A-D)match and MD0-6 lines output thermometer codes, as seen in Table 2 for some example match lengths and the associated output code values.

TABLE 2

Output from 32-bit IPCAM for different match lengths

| Length | A | B | C | D | MD6 | MD5 | MD4 | MD3 | MD2 | MD1 | MD0 |
|---|---|---|---|---|---|---|---|---|---|---|---|
| 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 1 |
| 5 | 0 | 0 | 0 | 0 | 0 | 0 | 1 | 1 | 1 | 1 | 1 |
| 12 | 0 | 0 | 0 | 1 | 0 | 0 | 0 | 1 | 1 | 1 | 1 |
| 16 | 0 | 0 | 1 | 1 | 0 | 0 | 0 | 0 | 0 | 0 | 0 |
| 23 | 0 | 0 | 1 | 1 | 1 | 1 | 1 | 1 | 1 | 1 | 1 |
| 29 | 0 | 1 | 1 | 1 | 0 | 0 | 1 | 1 | 1 | 1 | 1 |
| 31 | 0 | 1 | 1 | 1 | 1 | 1 | 1 | 1 | 1 | 1 | 1 |
| 32 | 1 | 1 | 1 | 1 | 1 | 1 | 1 | 1 | 1 | 1 | 1 |

The CAM head cells are written and read by placing the data to be stored on the combination search/bit lines SL and SLN and asserting the WLa word line to write the address storage or the WLm word line to write the mask storage. This aspect of the circuit is completely conventional. The IPCAM match lines are made pseudo-static by the pMOS keeper transistors on each of them (see FIG. 4). Here, we reduce the gate overdrive of the pMOS transistor by one PMOS transistor threshold voltage. Referring to FIG. 4, a pMOS pull down transistor limits the keeper transistor $V_{GS}$. This configuration reduces the keeper transistor capacitance and thus power dissipation by 6.6% on a match line discharge.

Referring to FIG. 4, prefixes are stored with MSB to the right and LSB to the left. The Mask bits are thus set from left to right. For instance, if the prefix length is 24 bits, then group A is left out of the prefix search for that entry. The longest prefix that can match is 24 bits, so these match lines are permanently discharged by the mask bits in the CAM head cell. These match lines are never pre-charged, since the PMOS transistor MP1 in the PMOS stack composed of transistors MP1-2 (see FIG. 4) disables that operation. To avoid failure due to leakage or noise, the match line is held low by transistor MN1, also controlled by the mask bit state. Thus, unlike in the TCAM, no power is dissipated in masked bit values. Returning to the example where all bits in group A are masked, the maximum output code is then (A)match=0, (B-D)match=1 and MB0-6=0 indicating a 24 bit match.

There is no need to sort inputs by mask order. This contrasts with the TCAM design, where the prefixes must be strictly ordered to allow the priority circuitry to operate. But in the IPCAM design of the present invention, the masking forces the largest possible match and so sorting is not necessary. This greatly eases removing or adding entries, since they need never be shuffled as they must in a TCAM design.

The multiplexing CMOS transmission gates in FIG. 4 are disabled during the precharge operation by logically ANDing with the controlling signal del_clk. This is necessary since masked match lines are always driven low and these bits would otherwise interfere with the pre-charging in subsequent groups. The full group match lines M(A-D)7 are not multiplexed in the same manner as the others, as they are essentially redundant with (A-D) match, all of which must be output.

In the present example, the search line drivers are placed in the bank center to drive 32 addresses differentially to entries both above and below them. Signals SL and SLN are driven low during the precharge phase of the clock allowing match lines to precharge. For IPv4, 32 search lines are needed for each address. Hence a total of 32×(N/64) search line drivers are required.

Comparison: TCAM Match Block vs. Dynamic IPCAM Match Block

While the dynamic IPCAM design matches up to 32 bits, the actual power and area savings is less than that found by calculating based on one entry in the IPCAM and 32 entries in an equivalent TCAM. Whereas a TCAM row is required for each match length, only a handful of addresses are 32-bits long, since this fully specifies a destination.

Border gateway protocol (BGP) routing tables contain nearly 220K entries. The average prefix length is 22, with 24-bit prefixes comprising 53% of the entries. Consequently, for power and area comparisons between our IPCAM and equivalent TCAM circuits we use the average BGP table prefix length of 22. The following analysis assumes the CAM search line drivers drive 64 rows of either TCAM or IPCAM cells, which was used in all simulations and layouts. We treat the search line driver power separately, since considerably more are needed for the equivalent capacity TCAM array.

Figure 5:
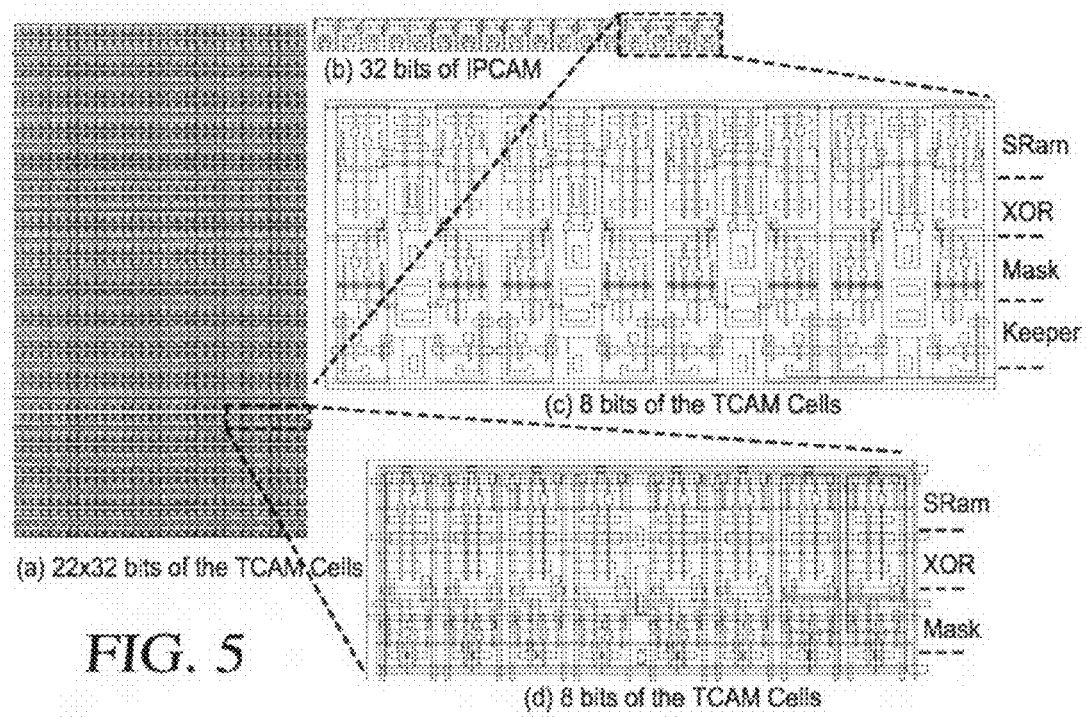
FIG. 5 shows comparative schematics between TCAM array and dynamic IPCAM array implementations.

The IPCAM and PE designs, as well as a representative TCAM array, have been implemented in a foundry bulk CMOS 65-nm technology. This allows simulations using extracted values from the layout, properly accounting for wire loading and resistance—capacitance (RC) effects on delay. FIG. 5(a) shows the layout of 22×32 TCAM cells to the same scale as one 32-bit IPCAM entry shown in FIG. 5(b). One 32-bit IPCAM entry replaces, depending on the mask settings, 22 entries on average as mentioned above. The area improvement between the 22 entry TCAM array and the single IPCAM entry is clearly evident. Layout details of the 8-bit IPCAM slice and eight TCAM cells are also shown in FIGS. 5(c) and 5(d), respectively.

Figure 2:
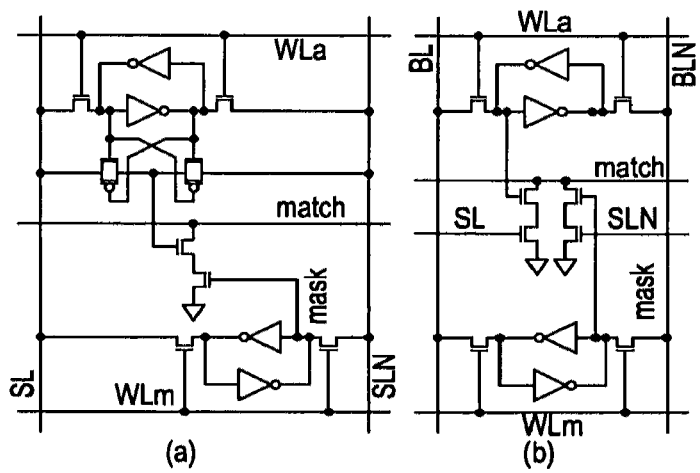
FIG. 2 shows schematics for two implementations of TCAM array cells.

Each TCAM cell requires 18 transistors [see FIG. 2(a)]. Implementing a 22-bit (maximum match length) address the average number of entries require 12,672 (22×32×18) transistors for the TCAM array. The same prefix match capability in the proposed architecture uses 1532 transistors. The array savings is thus 88%. Compared to the densest TCAM circuit design for comparison, this advantage is 86%. Each TCAM cell (FIG. 2(a)) in the target process is 1.31 by 3.46 µm. 32×22 cells thus occupies 3199 µm. Each 32 bit IPCAM entry is 67.15 by 4.72 m occupying 317 µm. Consequently, the proposed IPCAM density is approximately 10 times better.

The search/bit line drivers drive 64 rows of TCAM or 64 rows of IPCAM. Thus, approximately 22 times as many search/bit line (SL and SLN in FIG. 4) drivers are required for the TCAM as for the equivalent IPCAM longest prefix match search capacity. In the IPCAM, the worst-case search lines are more heavily loaded, driving eight pull down transistors for each entry. This makes the IPCAM search lines slightly slower with the same drive strength. The TCAM match line nMOS pull down transistors are sized to provide the same discharging current.

The TCAM and IPCAM power dissipation are determined by circuit simulation including parasitic capacitances and wire resistances extracted from the layout using Calibre PEX. We separated the search/match line driver power dissipation from that of the CAM arrays since the IPCAM requires far fewer of them.

Figure 6:
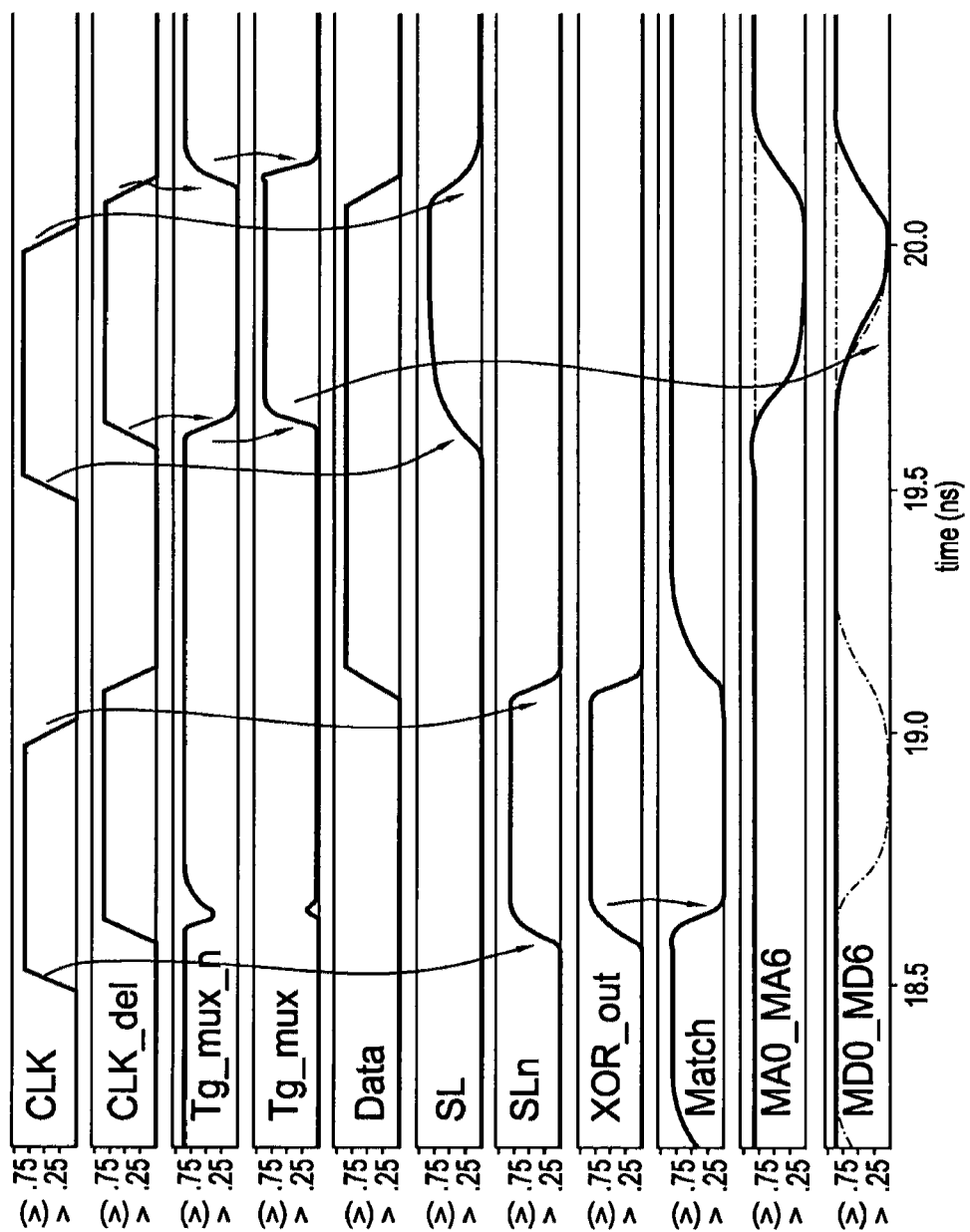
FIG. 6 shows a simulated operation and timing for the dynamic IPCAM of FIG. 4A.

FIG. 6 shows the simulated IPCAM operation. Limiting the design to 8-bit groups limits fan out on the CAM head XORout signals and also limits the group match line delay. The delay of the 32-bit IPCAM circuit is 385 ps from the clock assertion to the last match line signal out on MD6, where only one match line pull down nMOS transistor discharges the match line. The dynamic match results must be latched to hold their values in the subsequent clock phase. The TCAM design has similar delay in the worst-case, with one nMOS pull down transistor active, with a clock to match line discharge delay of 380 ps. Since the match occupies the first clock phase and precharge the second, both the TCAM and IPCAM can operate at better than 1 GHz clock frequencies in the target process.

Table 3(a) compares the power and delay for the two circuit architectures. Each IPCAM entry is equivalent to 22×32 (704) entries of TCAM for similar match output. Hence 64 IPCAM entries in one sub-array is equivalent (on average) to 1408 32-bit TCAM entries. The TCAM (requiring 22 32-bit entries) has 704 bits of storage compared to the equivalent single 32-bits plus mask IPCAM entry. The normalized TCAM energy/bit/search accounts for the TCAM requiring 22 entries on average per IPCAM entry. When the CAM energy per bit/search is normalized to be the same as the IPCAM, i.e., the address storage, rather than the larger number of bits required by the TCAM, the IPCAM circuit is shown to be about 10 times better. The simulations assume that the match lines miss and are discharged, since that is the common case in a large CAM, e.g., 64 k entries. Table 3(b) shows the power dissipation for 64 address entries, including that of the search line drivers. Hence for IPCAM 64×32 search lines are required. However, for TCAM 64×32×22 search lines are required. We assume one search line driver for every 64 entries, so the TCAM simulations include 22 more of those. For a specific address, many match lines will not discharge, but statistically, this number is insignificant—in the simulations we assume that all discharge.

TABLE 3(a)

| Architecture | Power (µW) | Mean energy (fJ/bit/search) | Delay (ps) |
|---|---|---|---|
| IP-CAM (1 entries) | 72.31 | 2.26 | 385 |
| TCAM (22 entries) | 792.0 | 1.13 | 380 |
| Normalized TCAM | 792.0 | 24.8 | 380 |

TABLE 3(b)

| Architecture | Power (µW) |
|---|---|
| 1-Search Line Driver | 19.6 |
| 1 Entry IP-CAM (up to 32 bit match) | 83.1 |
| 22-Entries TCAM (up to 22 bit match) | 1040 |
| 64-Address Match using IPCAM | 5945.6 |
| 64-Address Match using TCAM | 80351.4 |

TABLE 4

| Match Length | Power (mW) | Energy (fJ/bit/search) | Delay (ps) | Output Code |
|---|---|---|---|---|
| 32 | 4.761 | 2.32 | 66.42 | 1111_1111111 |
| 31 | 5.089 | 2.48 | 194.9 | 0111_1111111 |
| 30 | 5.232 | 2.55 | 381.7 | 0111_0111111 |
| 29 | 5.195 | 2.53 | 334.6 | 0111_0011111 |
| 28 | 5.293 | 2.58 | 395.9 | 0111_0001111 |
| 27 | 5.232 | 2.55 | 337.1 | 0111_0000111 |
| 26 | 5.162 | 2.52 | 341.8 | 0111_0000011 |
| 25 | 5.317 | 2.59 | 411.1 | 0111_0000001 |
| 22 | 5.160 | 2.51 | 268.9 | 0011_0111111 |
| 19 | 5.140 | 2.50 | 277.6 | 0011_0000111 |
| 15 | 5.165 | 2.52 | 241.6 | 0001_1111111 |
| 8 | 5.130 | 2.50 | 251.4 | 0001_0000000 |
| 7 | 4.772 | 2.33 | 196.7 | 0000_1111111 |
| 2 | 5.172 | 2.52 | 247.8 | 0000_0000011 |
| 1 | 5.135 | 2.50 | 249.6 | 0000_0000001 |
| 0 | 5.157 | 2.51 | 240.8 | 0000_0000000 |

Table 4 shows example match lengths and their output code values, as well as the power, energy per bit/search, and delay in the IPCAM. This simulation uses a 32×64 entry array and the search/bit line drivers. All columns participate in the match operation. This makes the simulation worst-case (skewed to disfavor the proposed IPCAM) since masking reduces this and on average 10 bits will be masked. Power dissipation depends on which 8-bit set is selected for the output. The worst case delay is for a 25-bit match length. In this case the signals MA0-MA6 have to propagate through the following three 7-bit groups; which all match. The propagation delay from driving the lower seven bits from the first IPCAM 8-bit group through the others, dominates the delay (FIG. 6).

IPCAM Match Block Circuit—Static Implementation

The proposed Static IPCAM (S-IPCAM) circuits follow the coding and match approach of the D-IPCAM described above, but use static CMOS gates throughout to reduce power. Moreover, removal of the pre-charge clock phase allows this circuit to operate at higher clock frequencies than the dynamic version.

Match Block—

Figure 7:
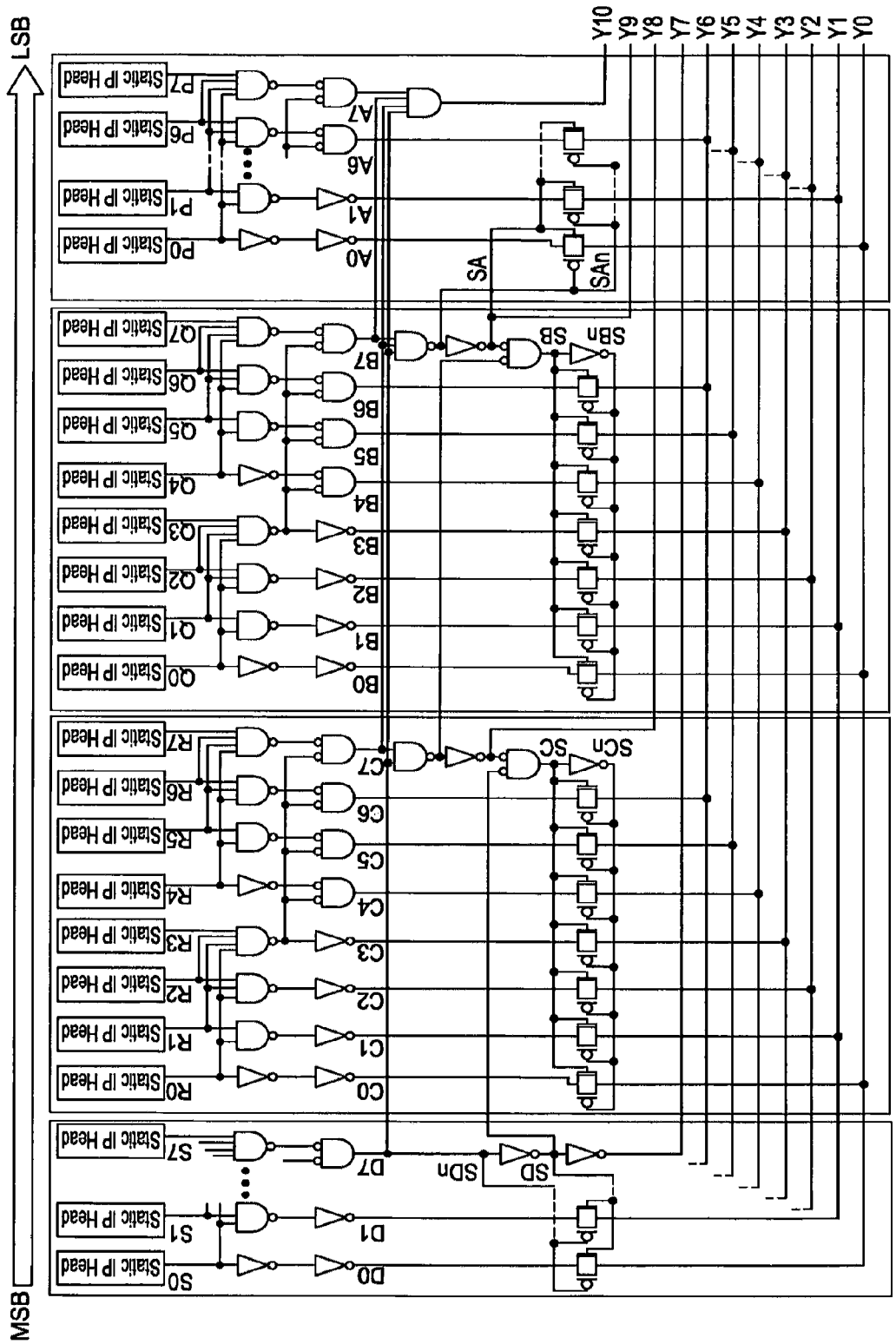
FIG. 7 shows a schematic of a static IPCAM array match block with static circuitry.

FIG. 7 shows a schematic for the static implementation of the IPCAM. The implementation is again for IPv4 32-bit IP addresses. The MSB of the address goes from the left side of the block and the LSB is the right most bit. The whole 32-bit implementation is split into four 8-bit blocks (A, B, C, D), generating the match information as D7-D0 from the MSB 8-bit sets, C7-C0 from next block and similarly to A7-A0 from the LSB block as is depicted in FIG. 7. Blocks A-D generate the match information in parallel to one-another. The outputs from each of these blocks are combined together using logic as explained in Table 6 so to generate two sets of thermometric codes (Y10-Y7 & Y6-Y0). The signals Y10-Y7 are generated as shown in Table 5:

TABLE 5

| Output | Combinations |
|---|---|
| Y7 | D7 |
| Y8 | D7 & C7 |
| Y9 | D7 & C7 & B7 |
| Y10 | D7 & C7 & B7 & A7 |

TABLE 6

| Y7 | Y8 | Y9 | Y10 | Y6-Y0 |
|---|---|---|---|---|
| 0 | X | X | X | D6-D0 |
| 1 | 0 | X | X | C6-C0 |
| 1 | 1 | 0 | X | B6-B0 |
| 1 | 1 | 1 | X | A6-A0 |

The block selects A6-A0 when 24-bits match or 32-bits match since for 32-bit matches the bits from Y6-Y0 are redundant and are thus not counted towards the number of matching bits. FIG. 7 shows that the worst case path for the signals is to propagate is from A6-A0 or from B6-B0 to the output Y6-Y0. Simulation of this case shows that the circuit delay is 270 ps, allowing the circuit to run above 2 GHz on 65 nm fabrication process.

The signals P(7-0) through S(7-0) represent the single bit matches of the stored IP address with the destination IP address. They are converted to eight bit thermometric codes A(7-0) through D(7-0), respectively using NAND, inverter and NOR gates as shown. The lower seven bits output from these blocks controls the signals from Y6-Y0 and Y10-Y7 are controlled based on the value of the most significant bit (A-D)7 from each block. Each CAM head circuit (see FIG. 8) drives the address lines and generates the match information of individual bits that are in turn used to generate the final output signals Y10-Y0.

Figure 9:
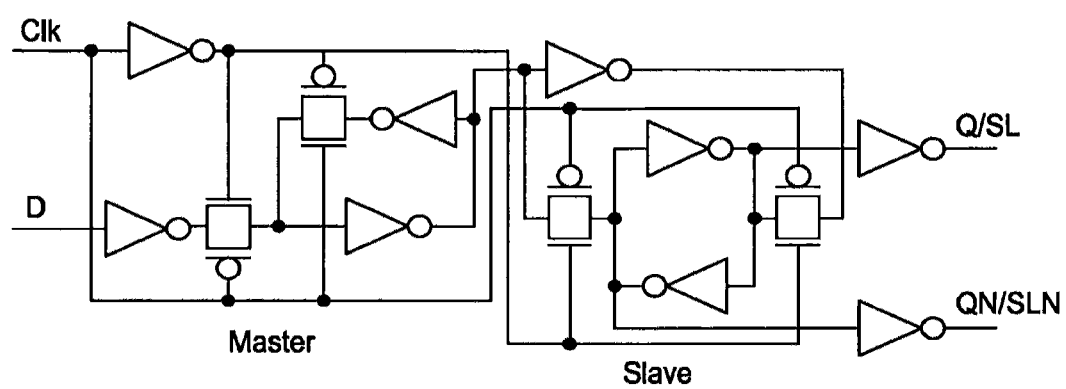
FIG. 9 shows a schematic of a differential output flip-flop used to generate search lines for the static IPCAM array match block of FIG. 7.

Since the matching network (see FIG. 7) is implemented using static CMOS gates, the match lines need not be precharged and the search lines do not need to be clock-ANDed. This allows a complete clock phase for the match operation. The differential search lines SL and SLn are generated using the rising edge triggered, differential output flip-flop circuit shown in FIG. 9. Each flip-flop drives 64 match blocks. The master latch is a conventional active low latch circuit. However, the slave latch is fully differential to achieve equal rise and fall times on the differential search lines during the high phase of the clock. This ensures similar timings through all match blocks.

The matching circuitry in each group of eight columns is built in two 4-bit groups, similar to carry lookahead circuits. Within the lower group, the most significant bit column's output controls the match output of the other less significant bits as shown in the FIG. 7. Thus, in each group the leftmost column, e.g., B7 in the B group, controls any of the eight match lines. The second, e.g., B6 controls 7 match lines. The rightmost controls only the match line corresponding to a single match on the rightmost bit, e.g., B0. Thus, the number of consecutive matching bits (the prefix) is encoded by B7-B0.

The code produced by the first 8-bit group that has a mismatch is driven out to match lines Y6-Y0. The four 8-bit groups are connected to Y6-Y0 by a transmission-gate multiplexer. The multiplexer selects S(A-D) and S(A-D)n are controlled by logically ANDing the MSB from each eight-bit block. For the MSB D-block, the multiplexer select signals are generated using invertors, however for rest of the blocks, multi-input AND gates are used. Thus the critical path is from the LSB A-block signals to output since the multiplexer select signals SA/SAn are generated using 4-input NAND and inverter. Thus in the worst case the signal SL/SLn traverses from flipflops to the output Y(10-0) through NAND NOR and invertor stages and finally multiplexed to the output in eight inversions.

When an entire group matches, i.e., all 8 bits in the group match the incoming address, that group signals out on one of the signals (A7-D7) match that this has occurred by asserting one of Y10-Y7. The AND gates ensure that proper codes are output. For example, if 8-bit groups A and B fully match, but there is a mismatch at the 5th bit in group C, then the multiplexer controlling Y6-Y0 selects group C, to indicate the state of the group C match lines C6-0. Assuming 4 bits match in group C, the outputs are Y8=Y7=1, Y9=Y10=0, Y0-3=1 and Y4-6=0. Again, the (Y10-7) match and Y0-6 lines output two sets of thermometer codes similar to the outputs generated by the D-IPCAM shown in Table 2. The output generated by the match block is a thermometer code as shown in Table 2. In a thermometer code, whenever a bit is asserted high, all the lower order bits are also high. Y10-Y7 indicate which 8-bit groups match completely (gated of course by the first group with a mismatch) and Y6-Y0 indicates the number of matches in the first 8-bit group with a mismatch. The next hop address is the one with the maximum match output.

Head Circuit—

Figure 8:
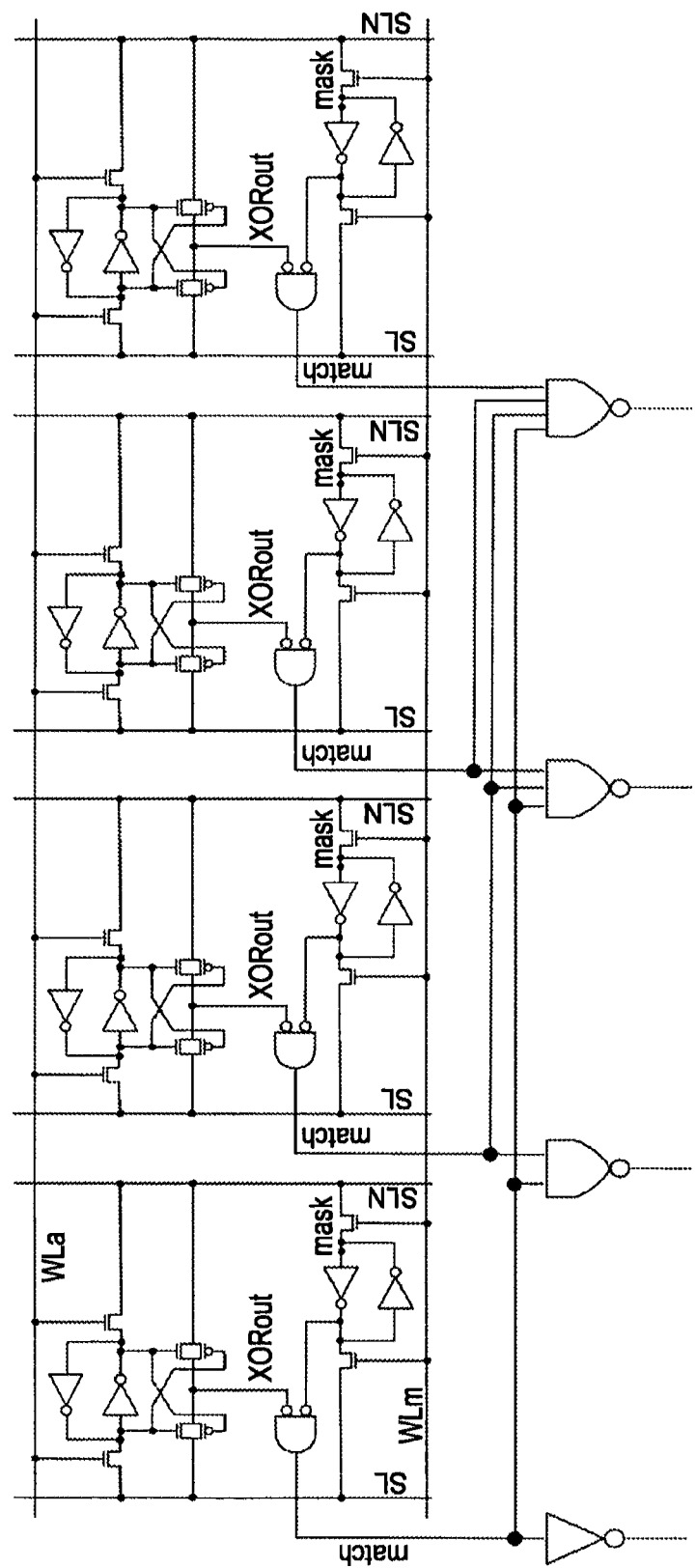
FIG. 8 shows a schematic of four static IPCAM heads with concatenated outputs from the static IPCAM array of FIG. 7.

The schematic of the Static IP CAM head is shown in FIG. 8, where four static IPCAM heads are shown with concatenated outputs. The CAM head circuit stores the address and mask, and traditional 6-T SRAM cell and XOR are used for estimating the match from the stored and the incoming address bits in the present example. The output of the XOR is masked off in the case that the Mask is not asserted for that particular bit using a 2-input NOR gate. The CAM function is provided by XORing the search lines with the stored address under the control of the mask bit. In operation, one of the clock controlled differential search lines for each of the 32 columns is asserted high in every clock cycle, starting the match operation. The XOR network in the CAM head cell in each column determines if the stored address matches the incoming address bit for that column. If it does not, the signal XORout (see FIG. 8) which drives one of the NOR gate inputs, is asserted high, thereby asserting the column bit-wise match signal bit_mat low. The CAM head cells are written and read by placing the data to be stored on the differential search/bit lines SL and SLN (see FIG. 8) and asserting WLa to write the address storage and/or WLm to write the mask storage. The mask storage controls the match value, i.e., whenever the mask is zero, the match will be low for that cell.

Masking—

The S-IPCAM operations assumes that the mask bits in the CAM head circuit are all high. Referring to FIG. 7, prefixes are stored with the least significant bit to the right and most significant bit to the left. The mask bits are thus set in order, depending on the address length, from left to right. For instance, if the prefix length is 24 bits, then group A is left out of the prefix search for that entry. The longest prefix that can match is 24 bits, so these match lines are permanently asserted low by the mask bits in the CAM head cell. These match lines never get asserted as one of the input of the head circuit NOR gate is high (NG1 in FIG. 8). Note that no power is dissipated in masked columns, since the bit_mat signal is fixed. Returning to the 24-bit address length example where all bits in group A are masked, the maximum output code is then Y10=0, (Y9-7) match=1 and Y0-6=0 indicating a 24-bit match.

Comparison: TCAM Match Block vs. Static IPCAM Match Block

To evaluate the performance of the proposed circuits, they are compared against the TCAM design and against each other. All designs are implemented in the same foundry 65 nm bulk CMOS technology. All mask bits were set so that all columns participated in the match operation. On average 10 bits will be masked. This forces the worst case S-IPCAM power condition, since masked bits do not contribute to power dissipation, this skews the results against our proposed design. The power is determined by simulating the circuit at 1 GHz. Area and delay computations are compared 64-entry blocks.

While the static IPCAM design presented in FIG. 7 matches up to 32 bits, a TCAM implementation requires entries with mask bits set for each of the possible shorter matches. For instance a 26-bit entry (six bits masked) will require up to 26 entries in the TCAM array. The border gateway protocol (BGP) routing tables contain nearly 220 k entries. The average prefix length is 22, with 24 bit prefixes accounting for 53% of the entries. Thus, to compare the S-IPCAM with a TCAM array, we use the average prefix length of 22. However, note that the number of entries is not 22, as there are a limited number of possibilities for short prefixes. For example, for a prefix length of 8-bits the number of possible entries is only 256. Similarly, for a prefix length of 9-bits only 512 entries are possible. Thus, a few entries cover all the prefixes for theses short (mostly masked) values. For prefix lengths of 16-bits and above, 64 k entries are possible for a routing table with 64 k entries. This leads to an average prefix length of 17 instead of 22, which we use in these comparisons—an array of 32×17 TCAM cells is, on average, required per entry. The S-IPCAM implements the same function with one entry since it compares all possibilities up to the mask length.

Figure 10:
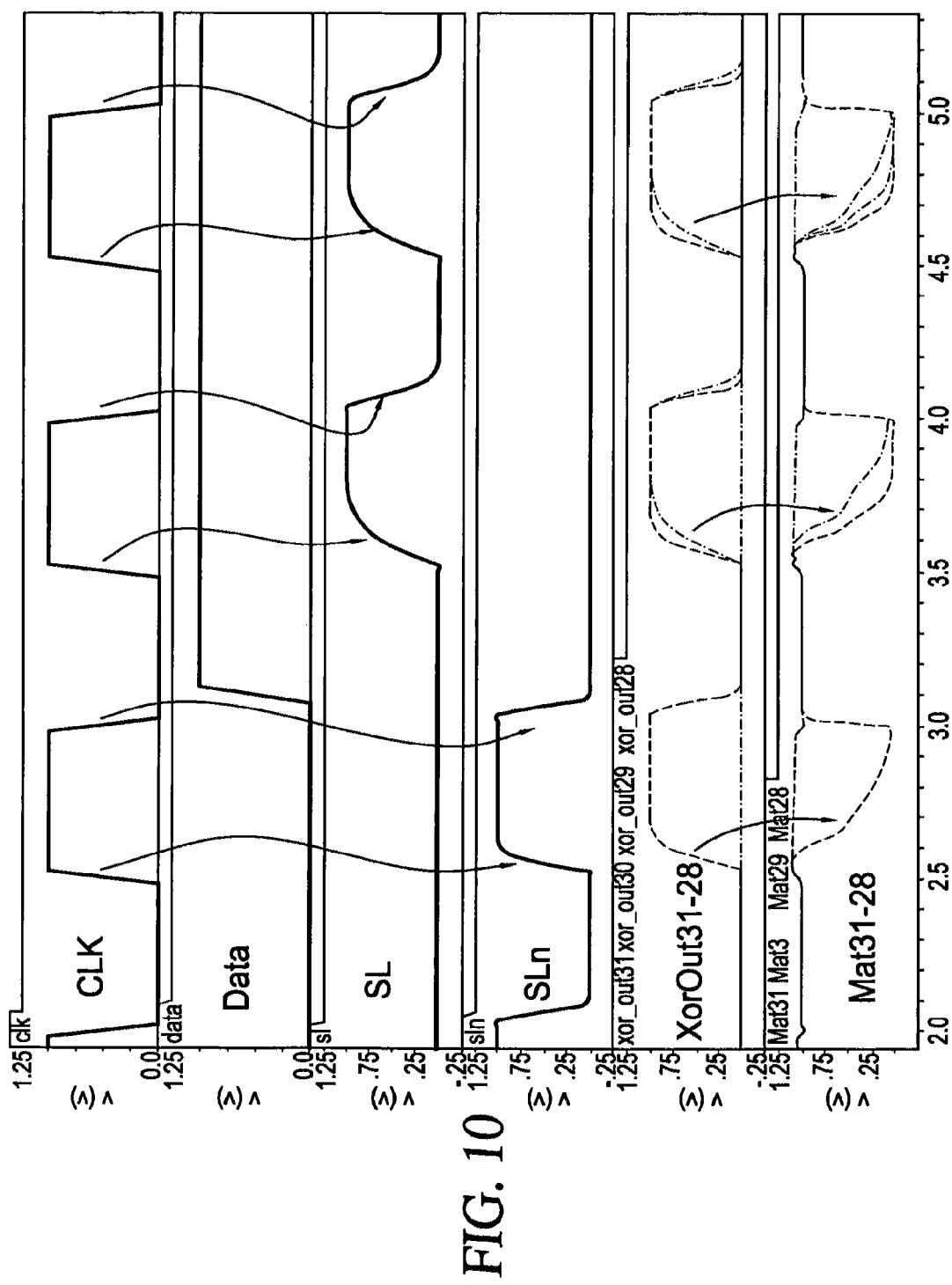
FIG. 10 shows a simulated operation and timing for a 64-entry TCAM array.
Figure 11:
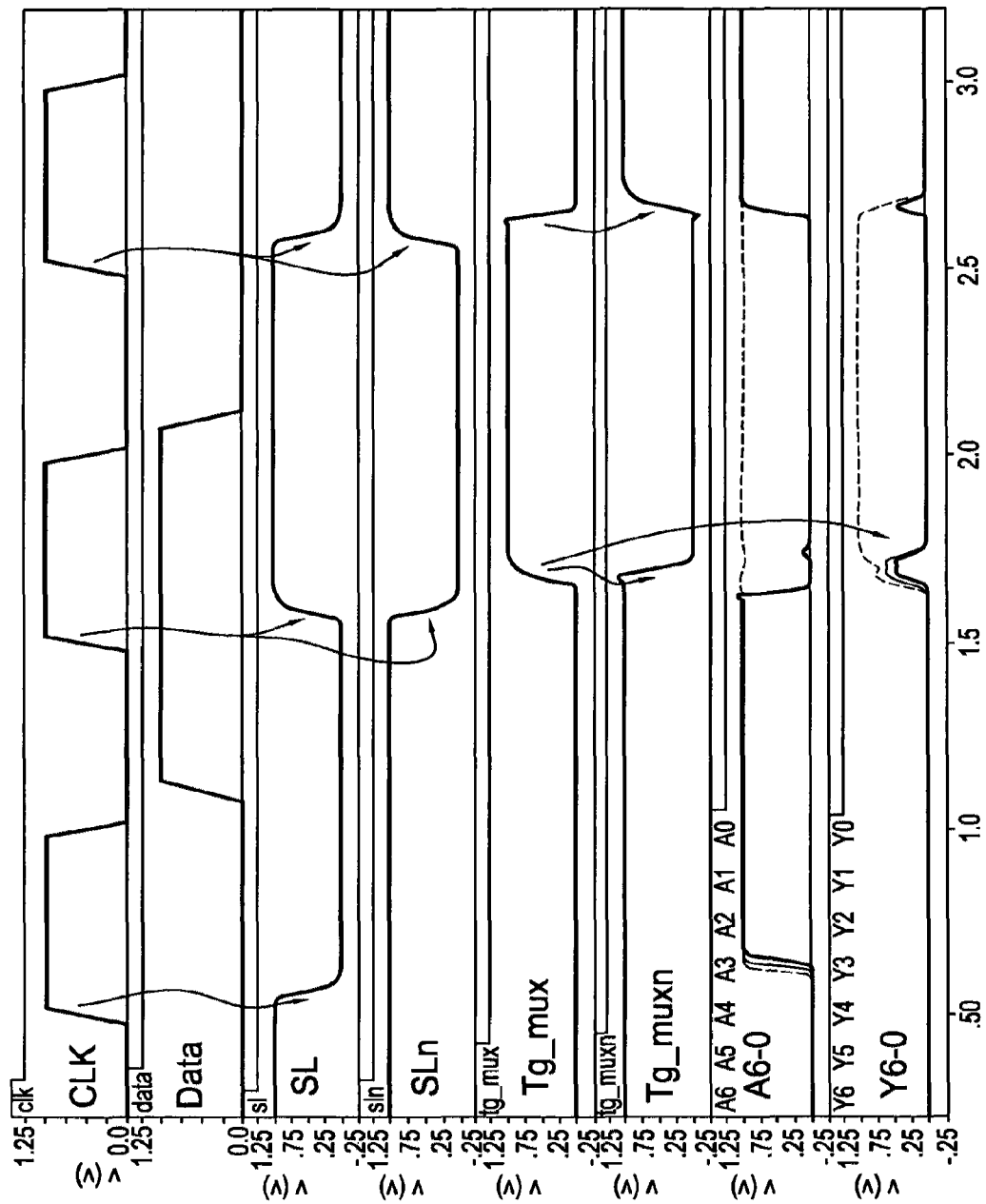
FIG. 11 shows a simulated operation and timing for a 64-entry static IPCAM array.

FIGS. 10-11 show the simulated operation for 64 entry TCAM and S-IPCAM arrays, respectively. The low fan-out of the CMOS static gates in the S-IPCAM allows a worst-case delay of only 281 ps. The TCAM worst-case delay is 380 ps. In the TCAM the match lines are dynamic, so the results must either be consumed in the first clock phase or latched for use in the subsequent clock phase. By including the latch and flip-flop delays required for pipelined operation of the following priority encode/select circuits, the TCAM is capable of 1.3 GHz operation, while the S-IPCAM, which requires no pre-charge phase, can be clocked at 3 GHz in the target process.

Each TCAM cell requires 18 transistors. Implementing a full 17 bit match, the average number of entries required for each address in a TCAM, requires 17×32×18 (=9792) transistors for the TCAM array, i.e., 17 arrays of 32 TCAMs are required. The same prefix match capability in the S-IPCAM uses 992 transistors. The array savings is thus nearly 90%.

To compare the overall power, the search/bit line drivers drive 64 TCAM or in the S-IPCAM the search/bit line flip-flops drive 64 rows (entries). Consequently, approximately 17 times as many search/bit line drivers are required for the TCAM based design with a proportional area cost.

The energy dissipation of the TCAM and proposed S-IPCAM circuits are determined by circuit simulation. Table 7 compares the energy, area and delay for 64 entry tables using the different circuit approaches. The simulations force the match lines to miss and discharge, since that is the common case in a large CAM, e.g., across 64 k entries. For a specific address, many match lines will not discharge, but statistically, this number is insignificant. The TCAM with 17 entries requires 32×17 (=544) bits of storage. Consequently, the search energy per bit stored is less (=2.23 fj/bit/search). But this is equivalent to 32-bits of storage required by the IPCAM single entry for up to 32-bit match detection. The normalized TCAM energy/bit/search accounts for the TCAM requiring 17 entries on average per static IPCAM entry. Post-normalization for the storage requirements, the S-IPCAM energy per search/bit is shown to be approximately 18 times better.

Comparison: Dynamic IPCAM Match Block vs. Static IPCAM Match Block

Table 7 also shows the simulation results for the energy, delay and transistor count between the Dynamic and Static IPCAM designs described herein. The dynamic implementation for D-IPCAM leads to high activity factor and hence the S-IPCAM dissipates about 3.4 times less power than the D-IPCAM. The worst case delay for D-IPCAM is when output traverses through three stages of multiplexers. However for S-IPCAM the output traverses through only one stage of multiplexer—the cost is in more routing layers being required for the latter. Hence, although static, the S-IPCAM is 27% faster than the D-IPCAM. Also the S-IPCAM has a 10% lower transistor count.

TABLE 7

| Designs | Energy (fJ/bit/search) | No. of Transistors | Delay (ps) | Freq (GHz) |
|---|---|---|---|---|
| TCAM | 37.91 | 670,381 | 380 | 1.31 |
| Dynamic IPCAM | 6.98 | 71,588 | 388 | 1.28 |
| Static IPCAM | 2.05 | 64,704 | 281 | 3.54 |

Priority Encoder—Overview

Determining the number of entries in the forwarding table matching the incoming destination IP address is only a partial solution to finding the next hop address. This has only determined potential next hop. The next hop corresponding to the longest prefix match which represents the optimal choice is then determined by a priority encoder to forward the incoming packets.

For both the Dynamic IPCAM implementation (FIG. 4) and the Static IPCAM implementation (FIG. 7), the outputs generated by the proposed IPCAM circuit can be split into two groups of thermometric codes. In the case of the Dynamic IPCAM (FIG. 4), one group consist of four bits of outputs A-D and the other group consists of seven bits from MD6-MD0. In the case of the Static IPCAM (FIG. 7), one group consist of four bits of outputs Y10-Y7 and the other group consists of seven bits from Y6-Y0. An efficient priority encoder compares the 11-bit outputs from two sets latched output of 32-bit IPCAM and generates the greater out of them.

Priority Encoder—Dynamic Implementation

Figure 12:
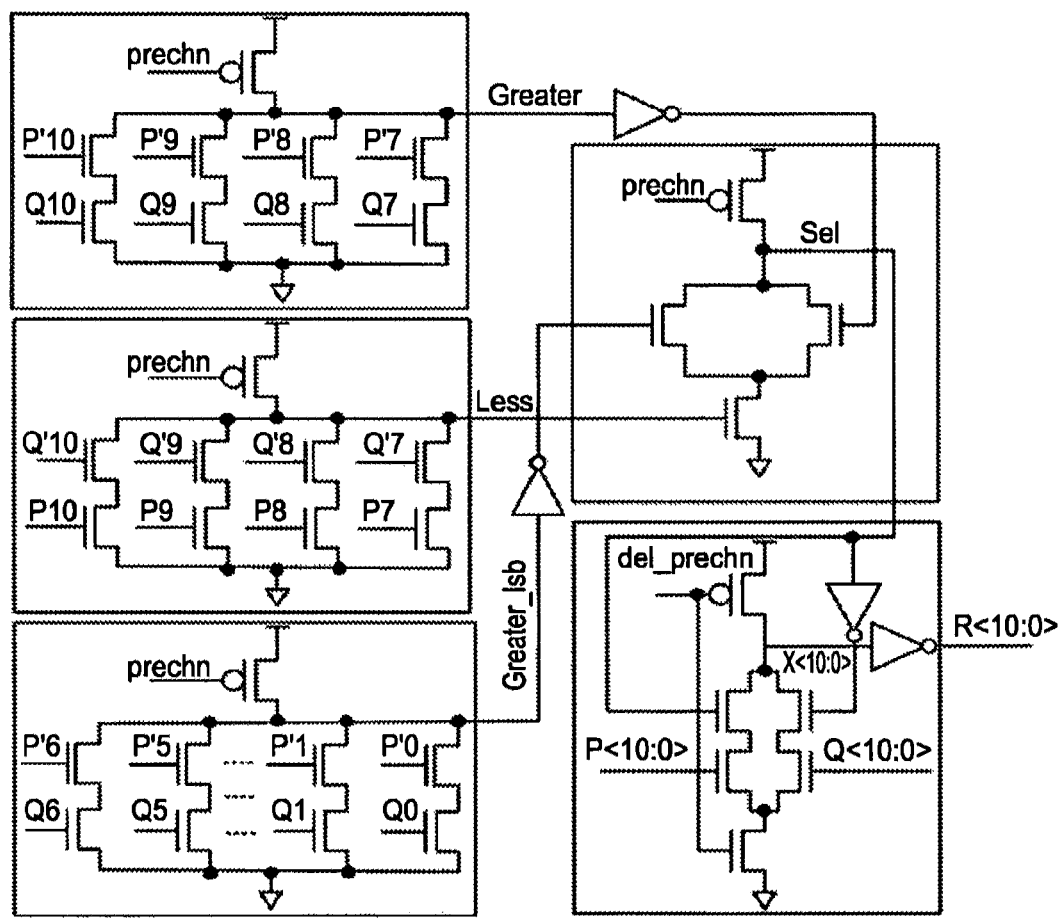
FIG. 12 shows a schematic of a dynamic priority encoder.

An implementation of a dynamic priority encoder is shown in FIG. 12, where all the blocks are implemented using dynamic logic. The signals Greater, Less, and Greater_lsb are generated using dynamic logic. They are precharged high during the precharge phase of the clock. The inputs P<10:0> and Q<10:0> are driven low during this phase so as to hold the outputs high and avoid a "hot-D2" condition in this D2 (unfooted) dynamic logic. The logic implements a dynamic-nor operation to generate the Greater, Less, and Greater_lsb signals. The worst case delay path would be when only one pull-down nmos opens up and tries to pull the precharged signal to low. The Greater signal signifies greater than or equal to. Hence for this implementation the signals Greater and Less will never go to '0' simultaneously. This fact is used for generating the Sel signal using dynamic logic. The signals Greater and Greater_lsb are inverted before giving input to sel generation logic as to hold sel high during the precharge phase. The complete dynamic implantation stages D1-D2-D2-D1 logic implementation and hence it allows many priority encoders to be cascaded in binary tree fashion to produce the entire priority encoder/multiplexer to produce the overall best matching address pointer (next hop address pointer).

The last stage mux implemented is a D1-dynamic mux. The clock signal used is a delayed version of the prechn signal. The del_prechn signal should arrive only after sel evaluates to a value. Simulation using IBM-65nm technology shows the sel evaluates in 48.2 ps hence del_prechn clock is delayed by 50 ps with respect to the prechn signal. The circuit has a high activity factor thereby incurring greater power dissipation.

Priority Encoder—Static Binary Tree Implementation

Figure 13:
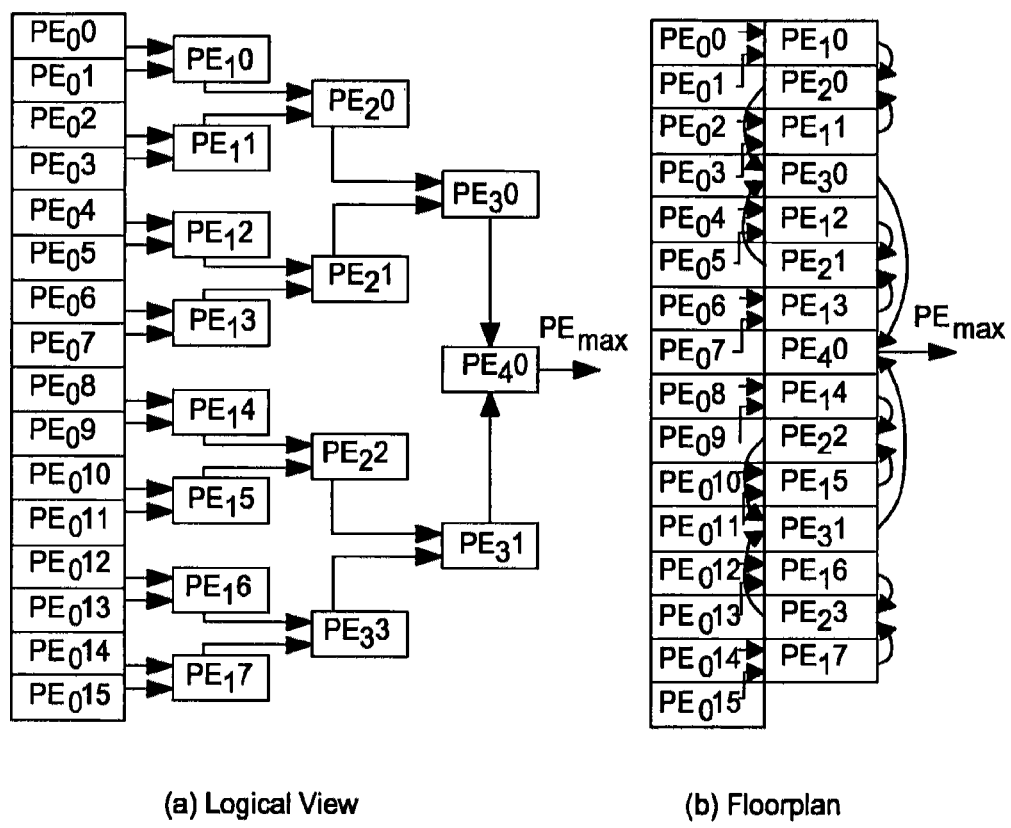
FIG. 13 shows an organization of a static binary tree priority encoder implementation.

FIG. 13 shows the basic organization of a static binary tree priority encoder implementation. The priority encoder is composed of a binary tree of comparison and forward sorting circuits, each comparing input vectors P<10:0> and Q<10:0>, comprised of the IPCAM 11-bit match circuit outputs A-D concatenated with outputs AD6-AD0 or the same vectors from a previous stage. The maximum of P and Q is dominated by the upper four bits, which determine the number of 8-bit groups matching. Thus, if the P<10:7> is greater than Q<10:7> then P and its associated IPCAM entry address is assigned to the sorting circuit output R. Otherwise, Q and its associated IPCAM address is output. However when these MSB bits are equal for P and Q then R is assigned based on the best match length as described by the lower order bits P<6:0> and Q<6:0>.

As seen in FIG. 13, there are ½ as many sorting circuits at each subsequent level of the binary tree. Latches are required to hold the outputs of the dynamic IPCAM circuits during the precharge clock phase. The priority encoding begins in the first clock phase, as soon as the IPCAM match block outputs are valid. This time-borrowing allows 6 priority encoder stages in the clock cycle after the match block, although another transparent latch is required within that 6 priority encoder stage unit. The rest of the pipeline stages use master-slave flip-flops. The height of each priority encoder compare block is equal to the height of two IPCAM match block entries. In order to minimize the wire length, the 5-stage priority encoder is placed in the middle. For a 64 k entry IPCAM, the total chip area is approximately 5×5 mm, so the maximum wire length is about 2.5 mm. Simulations using the foundry supplied interconnect RC models were used to optimize the number of inverting repeaters. They are placed every 500 μm.

Figure 14:
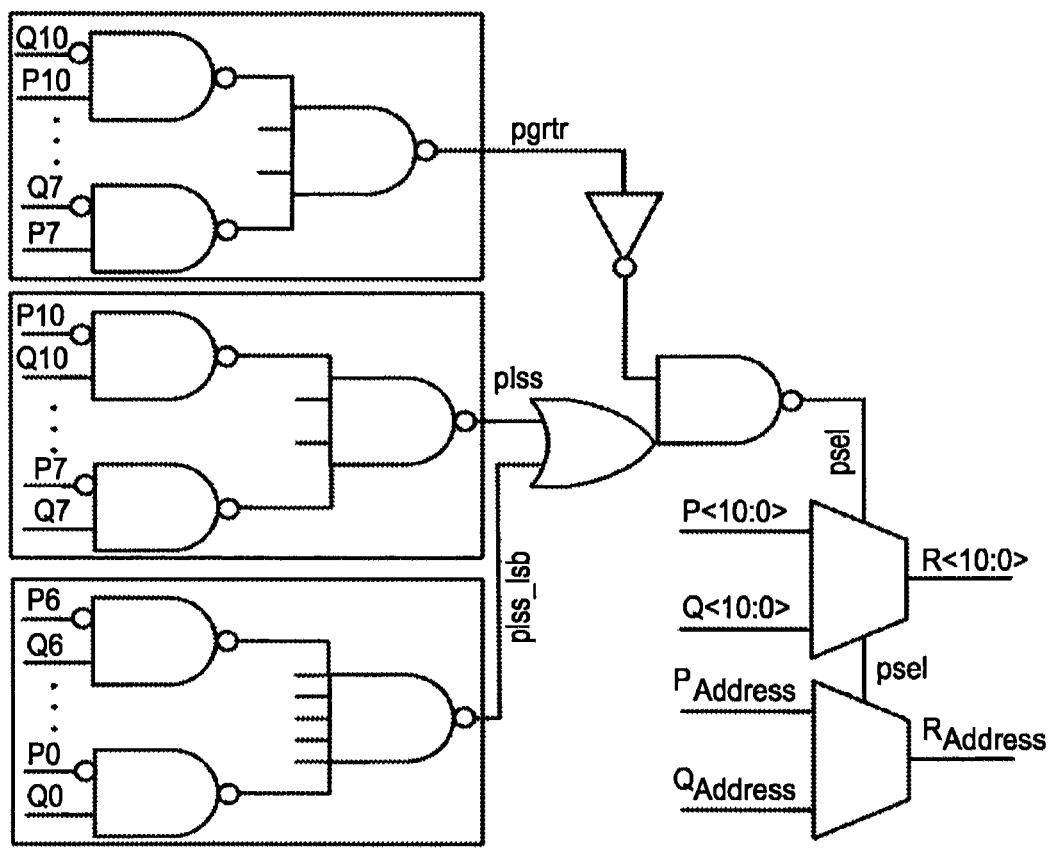
FIG. 14 shows a static priority encoder sorting circuit for the binary tree of FIG. 13.

FIG. 14 shows a static priority encoder sorting circuit, composed of a comparator and forwarding multiplexers. We opted for a simple static comparison circuit, to avoid high clock power and because it allows easier pipelining. Additionally, static logic affords a significant reduction in power dissipation. Vectors P<10:0> and Q<10:0> are the two 11-bit outputs from either the IPCAM or previous stages. The greater from any set of thermometric codes can be obtained as $$(P > Q) = \sum_{k=1}^{n} (P_k Q'_k)$$

where n is the number of bits in the thermometric code. The thermometer encoding greatly simplifies the comparisons. Basically, logically ANDing the complement of one vector Q with the other P and then logically ORing the resulting bit vector determines if P is greater.

Referring to FIG. 14, signals pgrtr and plss correspond to the first group of the thermometric code (10 bits to 7). Signal plss is generated using the same circuit as for the pgrtr signal but with the opposite true and complement input vectors. Signal plss_lsb corresponds to the next group of thermometric codes (6 bits to 0). If those match, the choice is arbitrary. The signals pgrtr plss and plss_lsb are defined with respect to signal P<10:0> i.e. signal pgrtr signifies is P<10:7> is greater than Q<10:7>. The 7-input NAND gate required for generating the signal plss_lsb is implemented using two logic stages (inversions). Signal psel selects the longest matching prefix from the two sets of incoming match by controlling the output multiplexer. The fact that both pgrtr and plss can never be asserted high simultaneously is exploited in the psel signal generation. Table 8 shows the details of the psel signal generation. 'X' denotes don't care conditions, of which the simultaneous assertion of pgrtr and plss is the most important. The 2:1 PE sorting circuit requires 5 lightly loaded inversions to generate psel, which controls the multiplexer. The next hop address corresponding to the matches P and Q can similarly be muxed using the signal psel and passed on to the next stage.

TABLE 8

| pgrtr | plss | plss_lsb | psel |
|---|---|---|---|
| 0 | 0 | 0 | 1 (P) |
| 0 | 0 | 1 | 0 (Q) |
| 0 | 1 | X | 0 (Q) |
| 1 | 0 | X | 1 (P) |
| 1 | 1 | X | X |

Priority Encoder—Static Two-Stage Implementation

After each entry of the IPCAM match block generates the match information between the stored address and the input IP address, the best match, as well as its location, must still be determined. In order to find the best match from more than one match outputs, the upper groups (bits Y10-Y7 in the example of FIG. 7) are compared and the greater is selected. However, the lower bits (Y6-Y0 in the example of FIG. 7) must also be compared when the upper group bits match each other.

Since all the match blocks operate in parallel, they generate all outputs in one clock cycle. So an efficient circuit is needed to forward the longest match found, giving it priority over the other shorter prefix matches (or full misses).

Figure 15:
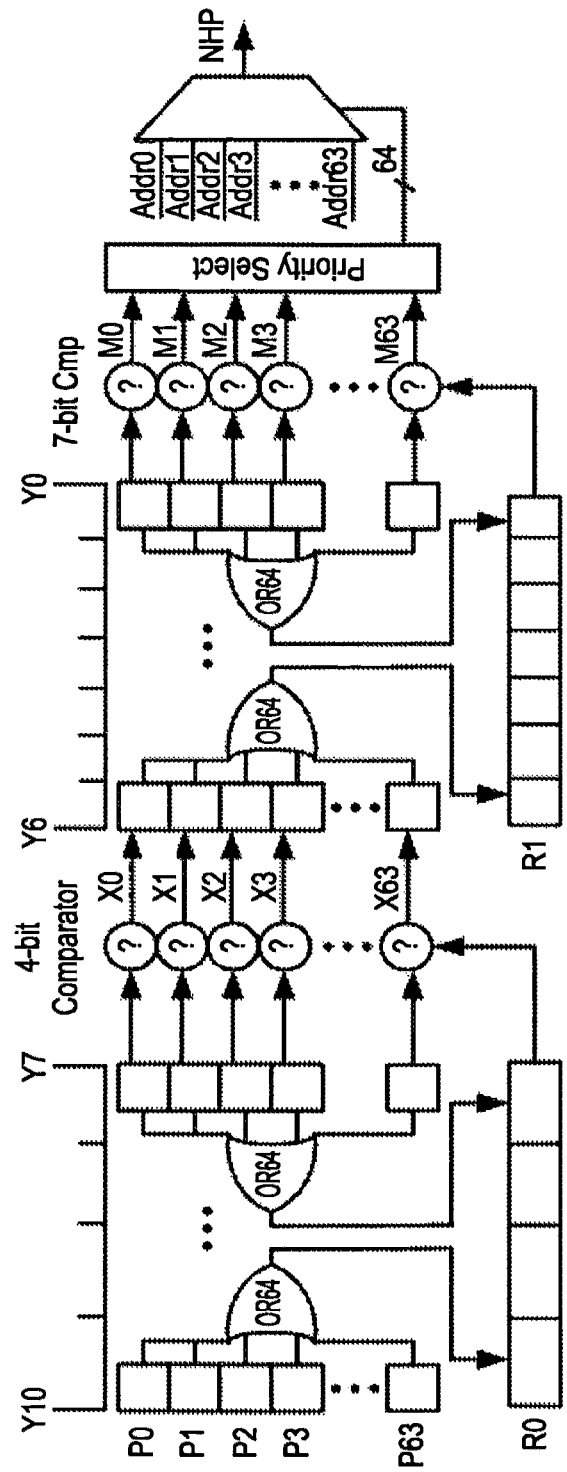
FIG. 15 shows a schematic for a two-stage static priority encoder implementation.

FIG. 15 illustrates a schematic of a static two-stage priority encoder block. Unlike our previous binary tree design described above, here we use 64:1 circuits rather than 2:1. Although the logic is more complicated, reduced data movement results in significant power as well as latency improvement.

Since the prefix match lengths are thermometer encoded, the maximum length match among a set of them can be obtained by bitwise ORing. For this operation, the eleven 64-bit static CMOS OR-gates (labeled OR64 in FIG. 15) are used. Each OR64 is implemented in three static inverting gates. In order to find which output matches the ORed output, a 4-bit comparator and 7-bit comparator are used for each of the group sets respectively. The comparators are simplified, again since the coding is thermometric, so that no XOR gates are required. Since the ORed output can only be greater than or equal to each match output, the comparator is implemented using $$(P = Q) = \sum_{k=1}^{n} (P'_k Q_k).$$

where n is the number of bits in the comparison, P is the individual match output and Q is the ORed output. The ORed output matches the entries whenever the equation evaluates to a zero because Q≥P for all the entries.

Figure 16:
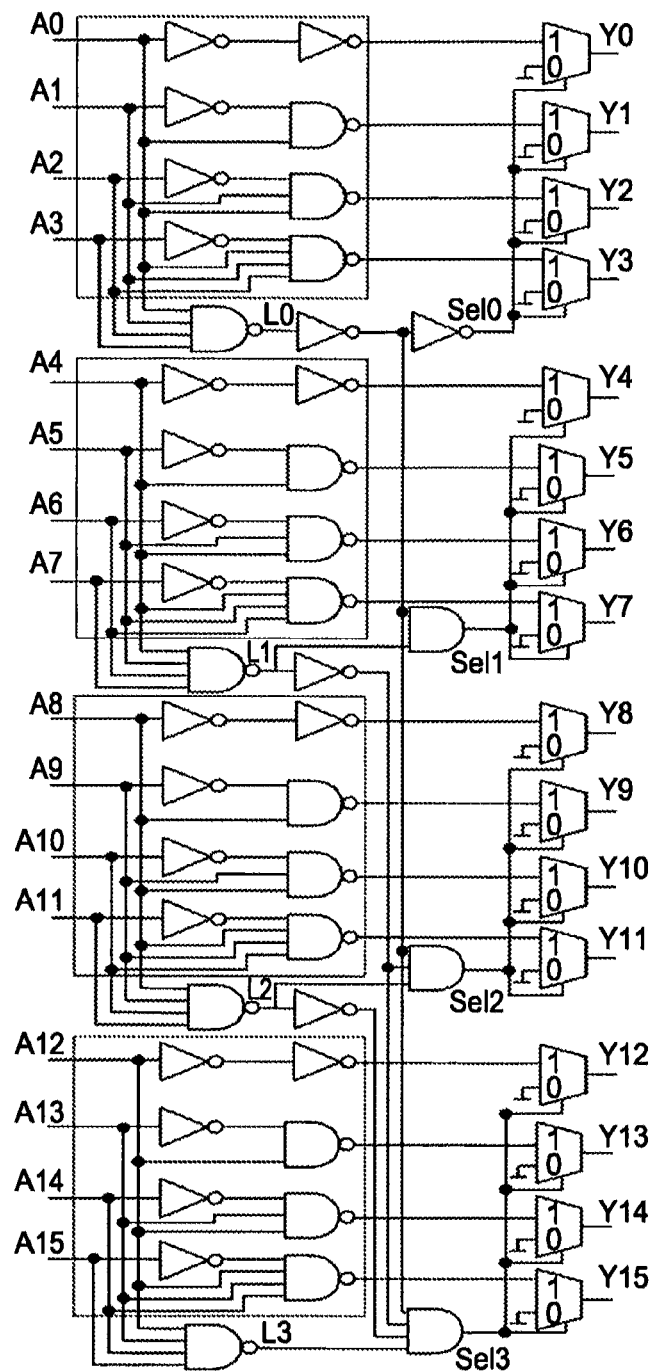
FIG. 16 shows a schematic of a 16-bit portion of a priority select circuit.

A priority select circuit is provided in the present example of FIG. 15 to select the first match (an arbitrary design choice) if two or more outputs from the IPCAM match block match each other. A 16-bit portion of the priority select circuit is shown in FIG. 16. It splits the 16-bits into nibble sized blocks and uses multi-level look-ahead to connect them. The multi-level look-head implementation is further extended to the next level of hierarchy for 64-bit priority select design. The priority select circuit in FIGS. 15-16 is optional.

To summarize the operation of the static implementation of the fast priority encoder circuit of FIG. 15, when the 64 matches are output from the S-IPCAM match block, the output code is treated as two sets. One set comprises bits 10-7 and the other group comprises bits 6-0. A column-wise OR of the 64 bits in each column first group generates the vector R0 that indicates the maximum value, and its position, among the input prefix match lengths. The 4-bit entries are then compared in parallel to determine the best entry. In the second, lower order group comprised of bits 6-0, only entries for which there is a match in the first group are similarly column-wise ORed to generate vector R1. The result is narrowed down to the longest matching prefix when the output length vector R1 is compared against them using a 7-bit comparator. Finally, in case multiple entries can match, the circuit determines the first match and drives the corresponding address to the PS output via a multiplexer. A tree of the 64:1 PS circuits allows determination of the match in a large S-IPCAM design. There can be examples where the fast priority encoder of Circuit of FIG. 15 need not comprise the priority select circuit.

Extension of Embodiments to Comply with IPV6
One Match per Clock Cycle Design—

The proposed Static IPCAM can be easily extended to IPv6 by widening the circuit to have an additional layer of hierarchy. This adds 4-bits to the output vector to indicate which 32-bit blocks match completely, and latency is slightly increased due to multiplexing the resulting values. The design consists of four 32-bit S-IPCAM entries concatenated to operate in parallel. The output from each stage is selected if all 32 bits (i.e., Y10 is set) in that particular stage are high. The encoded match information is tabulated in Table 9. For example, if Y10 from the left-most block is set, then the eleven bit match information Y9-Y0 is chosen from second block and the bits X3-X0 are set as 001 indicating a greater 32-bit match. Operation is perfectly analogous to the design as outlined above, but with 4-bit longer output vectors. The overall delay through the circuit and energy/bit/search is similar. However, owing to the greater circuit width, the power dissipation is up to four times greater.

Four Clock Cycles per Match Design—

Figure 17:
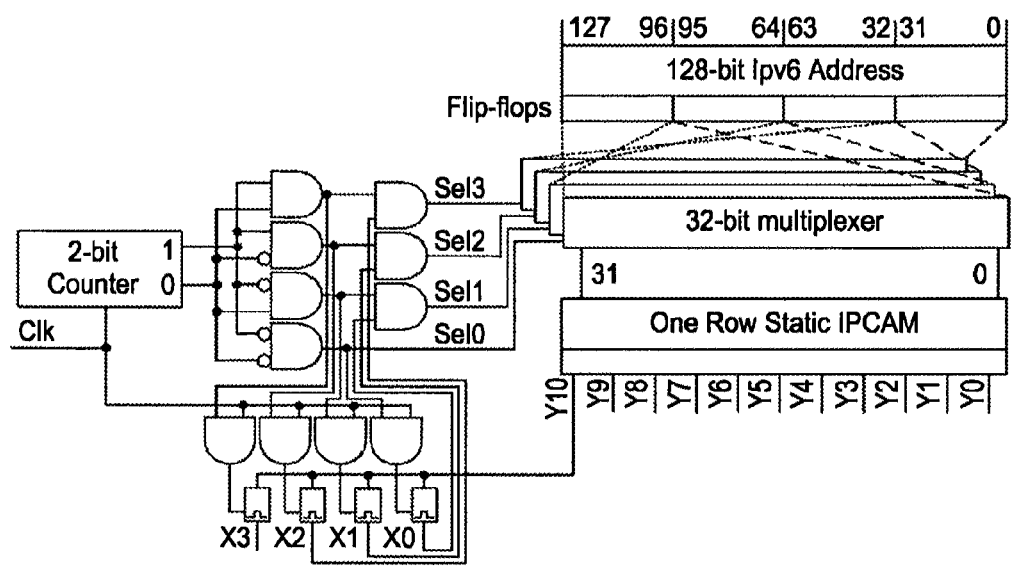
FIG. 17 shows a schematic for a IPv6 implementation of an IPCAM match circuit.
Figure 18:
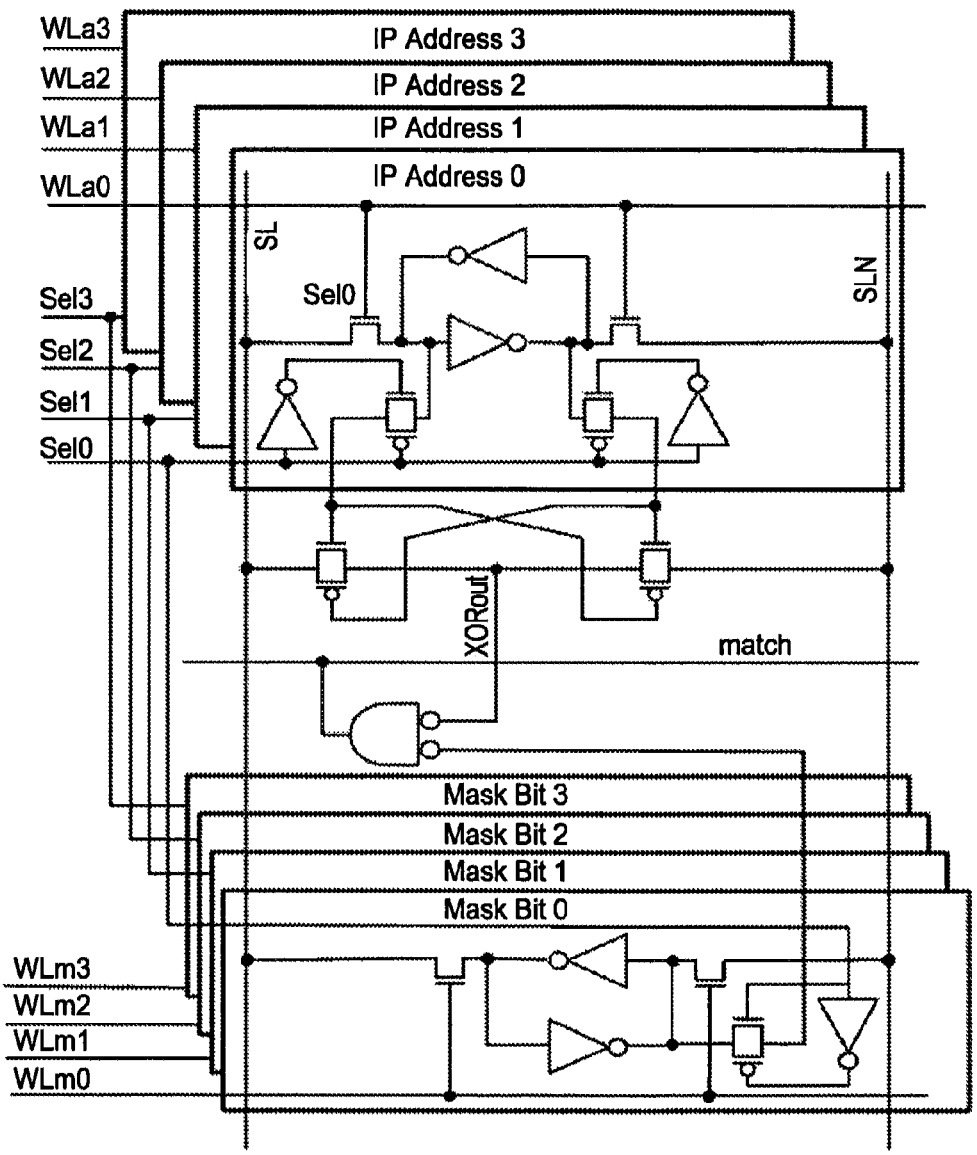
FIG. 18 shows a modified CAM head circuit for the implementation of FIG. 17.

The speed of this IPv6 approach is again far more than needed for current 10G Ethernet applications. In the IPv6 BGP tables, about 65% of the IPv6 addresses have 32-bit prefix lengths, and 23% have 48-bit prefix lengths. Hence, using the IPCAM match circuits in serial fashion, i.e., an IPv6 architecture where the match is obtained every four clocks may be appropriate. This circuit, outlined in FIG. 17, performs a matching operation spanning four consecutive clock cycles with one 32-bit comparison each cycle. A global 2-bit counter keeps track of which 32-bits of the 128-bit IPv6 address are currently being processed. A modified CAM head circuit capable of holding 4-bit of information every block is shown in FIG. 18. The address and corresponding mask values are stored in the SRAM based registers.

During the match operation the comparison of the address on the search lines is driven from the MSB towards the LSB in 32-bit groups. Each clock, the counter increments and passes the next 32-bit address block to the static IPCAM block. Each CAM head circuit stores the 128 bits of address information in four 32-bit blocks, each with the address and corresponding mask bits. Thus this architecture requires only one row of the S-IPCAM match circuits.

When all the bits of a group match, the next set of 32-bit address is compared in the next clock phase. Otherwise, the comparison process is terminated early, eliminating the subsequent pipeline stage(s) power dissipation. The output generated is 14-bits (X3-X0, Y9-Y7, Y6-0), comprised of three sets of thermometer codes as shown in Table 9. As before, the lowest order code indicates the number of single-bit matches, the middle encodes the number of 8-bit matches and the upper thermometer codes indicate the number of 32-bit matches. This architecture saves area by reducing the compare circuits by ¾, while reducing the average power dissipation by at least 50% as average prefix lengths in the BGP table for IPv6 is 46-bits.

TABLE 9

| Match Length | X3-X0 | Y9-Y7 | Y6-Y0 |
|---|---|---|---|
| 4 | 0000 | 000 | 0001111 |
| 17 | 0000 | 011 | 0000001 |
| 29 | 0000 | 111 | 0011111 |
| 86 | 0011 | 011 | 0111111 |
| 97 | 0111 | 000 | 0000001 |
| 106 | 0111 | 001 | 0000011 |
| 112 | 0111 | 010 | 0000000 |
| 124 | 0111 | 111 | 0001111 |
| 128 | 1111 | 111 | 1111111 |

Although the invention has been described with reference to specific embodiments, it will be understood by those skilled in the art that various changes can be made without departing from the spirit or scope of the invention. Accordingly, the disclosure herein is intended to be illustrative of the scope of the invention and is not intended to be limiting. It is intended that the scope of the invention shall be limited only to the extent required by the appended claims. To one of ordinary skill in the art, it will be readily apparent that the invention may be implemented in a variety of embodiments, and that the foregoing discussion of certain of these embodiments does not necessarily represent a complete description of all possible embodiments. Rather, the detailed description of the drawings, and the drawings themselves, disclose at least one preferred embodiment, and may disclose alternative embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An integrated circuit comprising:
 a first match block of one or more match blocks, the first match block comprising:
  a first IPCAM head module comprising:
   a first forwarding address memory to store a first forwarding address entry of one or more forwarding address entries; and
   an input to receive a destination address; and
  a first match circuit configured to:
   determine a longest matching prefix between the first forwarding address entry and the destination address; and
   encode a first encoded match length of the longest matching prefix.

2. The integrated circuit of claim 1, wherein:
 the first forwarding address memory comprises:
  a first address memory to store a first forwarding address of the first forwarding address entry; and
  a first mask memory to store a first mask of the first forwarding address entry; and
 the first encoded match length comprises a thermometer coding.

3. The integrated circuit of claim 2, wherein:
 the first match block requires a single entry of the first forwarding address to determine the longest matching prefix between the first forwarding address entry and the destination address.

4. The integrated circuit of claim 1, wherein:
 an architecture of the first match block is expandable to support at least one of:
  an IPv4 addressing scheme of 32 bits per address; or
  an IPv6 addressing scheme of 128 bits per address.

5. The integrated circuit of claim 1, wherein:
 each of the one or more match blocks is configured to store one forwarding address entry of the one or more forwarding address entries; and
 the one or more forwarding address entries are stored in the one or more match blocks regardless of match length order.

6. The integrated circuit of claim 1, wherein:
the first match block comprises a dynamic IPCAM array;
the first IPCAM head module comprises:
　a first group of IPCAM heads configured for a bitwise comparison between:
　　a first group of bits of the first forwarding address entry; and
　　a first group of bits of the destination address;
the first match circuit comprises:
　a first group of switches coupled to and controllable by the first group of IPCAM heads; and
　a first group of match lines coupled to and controllable by the first group of switches; and
the first group of switches is configured to control the first group of match lines so that a quantity of contiguous MSB matches from the bitwise comparison correlates with a quantity of enabled match lines of the first group of match lines.

7. The integrated circuit of claim 6, wherein:
the first group of match lines comprises a first match line;
the first group of switches comprises a first switch configured to control the first match line;
the first group of IPCAM heads comprises a first IPCAM head; and
the first IPCAM head comprises:
　a first search line configured to carry a first bit of the destination address;
　a first forwarding address bitcell of the first forwarding address memory;
　an XOR gate comprising:
　　XOR inputs coupled to the first forwarding address bitcell and to the first search line; and
　　an XOR output coupled to the first switch;
　a first charge circuit coupled to the first match line; and
　a first mask bitcell for the first forwarding address bitcell, the first mask bitcell coupled to the first charge circuit of the first match line.

8. The integrated circuit of claim 7, wherein:
the first forwarding address bitcell is configured to store a first forwarding address bit;
the first mask bitcell is configured to store a first mask bit;
the first charge circuit is configured to:
　precharge the first match line when the first mask bit is enabled; and
　discharge the first match line when the first mask bit is disabled; and
the XOR gate is configured to:
　actuate the first switch to discharge the first match line when the first bit of the destination address and the first forwarding address bit mismatch.

9. The integrated circuit of claim 6, wherein:
the first group of IPCAM heads comprises:
　a first IPCAM head; and
　a second IPCAM head;
the first group of switches comprises:
　a first switch set coupled to and controlled by the first IPCAM head; and
　a second switch set coupled to and controlled by the second IPCAM head;
the first switch set comprises:
　a first switch of the first switch set;
the second switch set comprises:
　a first switch of the second switch set; and
　a second switch of the second switch set; and
the first group of match lines comprises:
　a first match line coupled to and controlled by:
　　the second switch of the second switch set; and
　a second match line coupled to and controlled by:
　　the first switch of the first switch set; and
　　the second switch of the second switch set.

10. The integrated circuit of claim 9, wherein:
the first IPCAM head is configured to detect a first mismatch between:
　a first bit of the first forwarding address entry; and
　a first bit of the first destination address;
the second IPCAM head is configured to detect a second mismatch between:
　a second bit of the first forwarding address entry; and
　a second bit of the first destination address;
when the first IPCAM head detects the first mismatch:
　the second switch of the second switch set is actuated to discharge the second match line; and
when the second IPCAM head detects the second mismatch:
　the first switch of the first switch set is actuated to discharge the first match line; and
　the first switch of the second switch set is actuated to discharge the second match line.

11. The integrated circuit of claim 6, wherein:
the first match block further comprises:
　a second IPCAM head module comprising:
　　a second group of IPCAM heads configured for a bitwise comparison between:
　　　a second group of bits of the first forwarding address entry; and
　　　a second group of bits of the destination address;
　a second match circuit comprising:
　　a second group of switches coupled to and controllable by the second group of IPCAM heads; and
　　a second group of match lines coupled to and controllable by the second group of switches; and
　a first transmission module coupled between the first and second match circuits; and
when the first group of bits of the destination address matches the first group of bits of the first forwarding address entry at the first group of IPCAM heads:
　the first transmission module is enabled to couple the first and second groups of match lines together; and
　the second group of match lines are output from the first match block via the first group of match lines.

12. The integrated circuit of claim 11, wherein:
when the first group of bits of the destination address mismatches the first group of bits of the first forwarding address entry at the first group of IPCAM heads:
　the first transmission module is disabled to decouple the first and second groups of match lines together from each other; and
　the first group of match lines are output from the first match block.

13. The integrated circuit of claim 11, wherein:
the first match block further comprises:
　a first group-output match line of one or more group-output match lines; and
　a first group-match line comprising one match line of the first group of match lines;
the first group-match line is controllable by each IPCAM head of the first group of IPCAM heads via the first group of switches; and
when the first group of bits of the destination address matches the first group of bits of the first forwarding address entry at the first group of IPCAM heads:

the first group-output match line is enabled by the first group-match line to signal the match between the first group of bits of the destination address and the first group of bits of the first forwarding address entry.

14. The integrated circuit of claim 13, wherein:
the first match block further comprises:
  a third IPCAM head module comprising;
    a third group of IPCAM heads configured for a bitwise comparison between:
      a third group of bits of the first forwarding address entry; and
      a third group of bits of the destination address;
    a third match circuit comprising:
      a third group of switches coupled to and controllable by the third group of IPCAM heads; and
      a third group of match lines coupled to and controllable by the third group of switches;
  a second transmission module coupled between the second and third match circuits and configured to couple the third group of match lines to the second group of match lines when the second group of bits of the first forwarding address entry matches the second group of bits of the destination address;
  a fourth IPCAM head module comprising:
    a fourth group of IPCAM heads configured for a bitwise comparison between:
      a fourth group of bits of the first forwarding address entry; and
      a fourth group of bits of the destination address;
  a fourth match circuit comprising:
    a fourth group of switches coupled to and controllable by the fourth group of IPCAM heads; and
    a fourth group of match lines coupled to and controllable by the fourth group of switches;
  a third transmission module coupled between the third and fourth match circuits and configured to couple the fourth group of match lines to the third group of match lines when the third group of bits of the first forwarding address entry matches the third group of bits of the destination address;
  a second group-match line comprising one match line of the second group of match lines;
  a third group-match line comprising one match line of the third group of match lines; and
  a fourth group-match line comprising one match line of the fourth group of match lines;
  the second group-match line is controllable by each IPCAM head of the second group of IPCAM heads via the second group of switches;
  the third group-match line is controllable by each IPCAM head of the third group of IPCAM heads via the third group of switches; and
  the fourth group-match line is controllable by each IPCAM head of the fourth group of IPCAM heads via the fourth group of switches.

15. The integrated circuit of claim 1, wherein:
the first match block comprises a static IPCAM array;
the first IPCAM head module comprises:
  a first group of IPCAM heads configured for a bitwise comparison between:
    a first group of bits of the first forwarding address entry; and
    a first group of bits of the destination address;
the first match circuit comprises:
  a first group of encoding gates coupled to the first group of IPCAM heads to encode the bitwise comparison; and
  a first group of match lines configured to couple to the first group of encoding gates; and
the first group of encoding gates is configured to control the first group of match lines so that a quantity of enabled match lines of the first group of match lines indicates a quantity of contiguous MSB matches from the bitwise comparison.

16. The integrated circuit of claim 15, wherein:
the first group of IPCAM heads comprises a first IPCAM head;
the first IPCAM head comprises:
  a first search line configured to carry a first bit of the destination address;
  a first forwarding address bitcell to store a first bit of the first forwarding address entry;
  a first mask bitcell configured to store a first mask bit;
  an XOR gate comprising:
    XOR inputs coupled to the first forwarding address bitcell and to the first search line; and
    an XOR output; and
  a match gate comprising:
    a first input coupled to the XOR output;
    a second input coupled to the first mask bitcell; and
    a first match output;
when the first mask bit is asserted, the match gate is configured to de-assert the first match output; and
when the first mask bit is de-asserted, the match gate is configured to:
  assert the first match output when the XOR output indicates a match between the first bit of the destination address and the first bit of the first forwarding address entry; and
  de-assert the first match output when the XOR output indicates a mismatch between the first bit of the destination address and the first bit of the first forwarding address entry.

17. The integrated circuit of claim 15, wherein:
the first group of IPCAM heads comprises:
  the first IPCAM head comprising a first match output; and
  a second IPCAM head comprising a second match output;
the first group of match lines comprises:
  a first match line; and
  a second match line;
the first group of encoding gates comprises:
  a first gate comprising:
    a first gate input coupled to the first match output; and
    a first gate output to control the first match line; and
  a second gate comprising:
    a second gate input coupled to the first match output;
    a second gate input coupled to the second match output; and
    a second gate output to control the second match line;
the first match output of the first IPCAM head is asserted when:
  a first forwarding address bit of the first group of bits of the first forwarding address entry matches a first destination address bit of the first group of bits of the destination address;
the second match output of the second IPCAM head is asserted when:
  a second forwarding address bit of the first group of bits of the first forwarding address entry matches a second destination address bit of the first group of bits of the destination address; and the second gate is configured to:
   assert the second match line only when both the first and second match outputs are asserted.

18. The integrated circuit of claim 17, wherein:
the first group of IPCAM heads further comprises:
   a third IPCAM head comprising a third match output; and
   a fourth IPCAM head comprising a fourth match output;
the first group of match lines comprises:
   a third match line; and
   a fourth match line;
the first group of encoding gates comprises:
   a third gate comprising:
     a third gate input coupled to the first match output;
     a third gate input coupled to the second match output;
     a third gate input coupled to the third match output; and
     a third gate output to control the third match line; and
   a fourth gate comprising:
     a fourth gate input coupled to the first match output;
     a fourth gate input coupled to the second match output;
     a fourth gate input coupled to the third match output;
     a fourth gate input coupled to the fourth match output; and
     a fourth gate output to control the fourth match line;
the third match output of the third IPCAM head is asserted when:
   a third forwarding address bit of the first group of bits of the first forwarding address entry matches a third destination address bit of the first group of bits of the destination address;
the fourth match output of the fourth IPCAM head is asserted when:
   a fourth forwarding address bit of the first group of bits of the first forwarding address entry matches a fourth destination address bit of the first group of bits of the destination address;
the third gate is configured to:
   assert the third match line only when all of the first, second, and third match outputs are asserted; and
the fourth gate is configured to:
   assert the fourth match line only when all of the first, second, third, and fourth match outputs are asserted.

19. The integrated circuit of claim 17, wherein:
the first group of IPCAM heads further comprises:
   a fifth IPCAM head comprising a fifth match output;
   a sixth IPCAM head comprising a sixth match output;
   a seventh IPCAM head comprising a seventh match output; and
   an eighth IPCAM head comprising an eighth match output;
the first group of match lines comprises:
   fifth, sixth, seventh, and eighth match lines; and
the first group of encoding gates comprises:
   a fifth gate configured to assert the fifth match line only when all of the first, second, third, fourth, and fifth match outputs are asserted;
   a sixth gate configured to assert the sixth match line only when all of the first, second, third, fourth, fifth, and sixth match outputs are asserted;
   a seventh gate configured to assert the seventh match line only when all of the first, second, third, fourth, fifth, sixth, and seventh match outputs are asserted; and
   an eighth gate configured to assert the eighth match line only when all of the first, second, third, fourth, fifth, sixth, seventh, and eight match outputs are asserted.

20. The integrated circuit of claim 15, wherein:
the first match block further comprises:
   a group of bitmatch output lines; and
   a first transmission module coupled between the group of bitmatch output lines and the first group of match lines;
the first forwarding address entry comprises:
   forwarding address greater significant bits; and
   forwarding address lesser significant bits;
the destination address comprises:
   destination address greater significant bits;
when the first group of bits of the first forwarding address entry comprises the forwarding address greater significant bits, the first transmission module is configured to:
   couple the first group of match lines to the group of bitmatch output lines when the first group of bits of the first forwarding address entry mismatches the first group of bits of the destination address; and
when the first group of bits of the first forwarding address entry comprises the forwarding address lesser significant bits, the first transmission module is configured to couple the first group of match lines to the group of bitmatch output lines when both:
   the first group of bits of the first forwarding address entry mismatches the first group of bits of the destination address; and
   the destination address greater significant bits match the forwarding address greater significant bits.

21. The integrated circuit of claim 20, wherein:
the first match block further comprises:
   a first group-output match line of one or more group-output match lines;
when the first group of bits of the first forwarding address entry comprises the forwarding address greater significant bits:
   the first group-output match line is asserted when the first group of bits of the first forwarding address entry matches the first group of bits of the destination address; and
when the first group of bits of the first forwarding address entry comprises the forwarding address lesser significant bits:
   the first group-output match line is asserted when both:
     the first group of bits of the first forwarding address entry matches the first group of bits of the destination address; and
     the destination address greater significant bits match the forwarding address greater significant bits.

22. The integrated circuit of claim 20, wherein:
the first match block further comprises:
   a second IPCAM head module for bitwise comparison between:
     a second group of bits of the first forwarding address entry; and
     a second group of bits of the destination address;
   a second match circuit coupled to the second IPCAM head module and comprising a second group of match lines;
   a third IPCAM head module for bitwise comparison between:
     a third group of bits of the first forwarding address entry; and
     a third group of bits of the destination address;
   a third match circuit coupled to the third IPCAM head module and comprising a third group of match lines;
   a fourth IPCAM head module for bitwise comparison between:

a fourth group of bits of the first forwarding address
entry; and
a fourth group of bits of the destination address;
a fourth match circuit coupled to the fourth IPCAM head
module and comprising a fourth group of match lines;
a second transmission module coupled between the
group of bitmatch output lines and the second group
of match lines;
a third transmission module coupled between the group
of bitmatch output lines and the third group of match
lines; and
a fourth transmission module coupled between the
group of bitmatch output lines and the fourth group of
match lines;
the one or more group-output match lines further comprise:
first, second, third, and fourth group-output match lines;
the first group-output match line is asserted when:
the first group of bits of the first forwarding address entry
matches the first group of bits of the destination
address;
the second group-output match line is asserted when:
the first group of bits of the first forwarding address entry
matches the first group of bits of the destination
address; and
the second group of bits of the first forwarding address
entry matches the first group of bits of the destination
address;
the third group-output match line is asserted when:
the first group of bits of the first forwarding address entry
matches the first group of bits of the destination
address;
the second group of bits of the first forwarding address
entry matches the first group of bits of the destination
address; and
the third group of bits of the first forwarding address
entry matches the third group of bits of the destination
address; and
the fourth group-output match line is asserted when:
the first group of bits of the first forwarding address entry
matches the first group of bits of the destination
address;
the second group of bits of the first forwarding address
entry matches the first group of bits of the destination
address;
the third group of bits of the first forwarding address
entry matches the third group of bits of the destination
address; and
the fourth group of bits of the first forwarding address
entry matches the fourth group of bits of the destination address.

23. The integrated circuit of claim 1, further comprising:
a priority encoder coupled to the one or more match blocks;
wherein:
the one or more match blocks are configured to:
forward a plurality of encoded match lengths comprising an encoded match length from each of the one or more match blocks, including the first encoded match length; and
forward a plurality of forwarding addresses comprising a forwarding address from each of the one or more match blocks, including the first forwarding address entry; and
the priority encoder is configured to:
receive the plurality of encoded match lengths;
determine a longest encoded match length of the plurality of encoded match lengths; and
forward a longest matching prefix forwarding address that is:
selectable from the one or more forwarding address entries; and
associated with the longest encoded match length.

24. The integrated circuit of claim 23, wherein:
the priority encoder comprises at least one of:
a dynamic priority encoder;
a static binary tree priority encoder; or
a static two-stage columnwise-OR priority encoder.

25. A method comprising:
providing a first match block of one or more match blocks of a content addressable memory integrated circuit;
wherein providing the first match block comprises:
providing a first IPCAM head module comprising:
a first forwarding address memory to store a first forwarding address entry of one or more forwarding address entries; and
an input to receive a destination address; and
providing a first match circuit configured to:
determine a longest matching prefix between the first forwarding address entry and the destination address; and
encode a first encoded match length of the longest matching prefix.

26. The method of claim 25, further comprising:
providing a priority encoder coupled to the one or more match blocks; wherein:
the one or more match blocks are configured to:
forward a plurality of encoded match lengths comprising an encoded match length from each of the one or more match blocks, including the first encoded match length; and
forward a plurality of forwarding addresses comprising a forwarding address from each of the one or more match blocks, including the first forwarding address entry; and
the priority encoder is configured to:
receive the plurality of encoded match lengths;
determine a longest encoded match length of the plurality of encoded match lengths;
forward a next hop address associated with the longest encoded match length, the next hop address comprising a longest matching prefix forwarding address entry of the one or more forwarding address entries.

27. The method of claim 25, wherein:
providing the first match block comprises:
providing the first match block to comprise only static circuitry.

* * * * *